United States Patent [19]

Whetsel

[11] Patent Number: 5,054,024

[45] Date of Patent: Oct. 1, 1991

[54] SYSTEM SCAN PATH ARCHITECTURE WITH REMOTE BUS CONTROLLER

[75] Inventor: Lee D. Whetsel, Plano, Tex.

[73] Assignee: Texas Instruments Incorporated, Dallas, Tex.

[21] Appl. No.: 391,801

[22] Filed: Aug. 9, 1989

[51] Int. Cl.⁵ .............................................. G01R 31/28
[52] U.S. Cl. .................................. 371/22.3; 371/22.1
[58] Field of Search ............................. 371/22.1, 22.3; 324/73.1

[56] References Cited

U.S. PATENT DOCUMENTS 4,494,066  1/1985  Goel et al. ......................... 371/22.3
4,710,931 12/1987  Bellay et al. ...................... 371/22.3

Primary Examiner—Charles E. Atkinson
Attorney, Agent, or Firm—B. Peter Barndt; James T. Comfort; Melvin Sharp

[57] ABSTRACT

A system scan path architecture is provided by a device select module (DSM) (18) which may be used in conjunction with associated circuits (16a-b) to select secondary scan paths (PATH1-m) on each circuit for coupling with a primary scan path on a test bus (14). The test bus (14) is controlled by a primary bus master (12). Remote bus masters (124) may be used in conjunction with the DSMs (18) to provide serial-scan testing independent of the primary bus master (12).

58 Claims, 11 Drawing Sheets

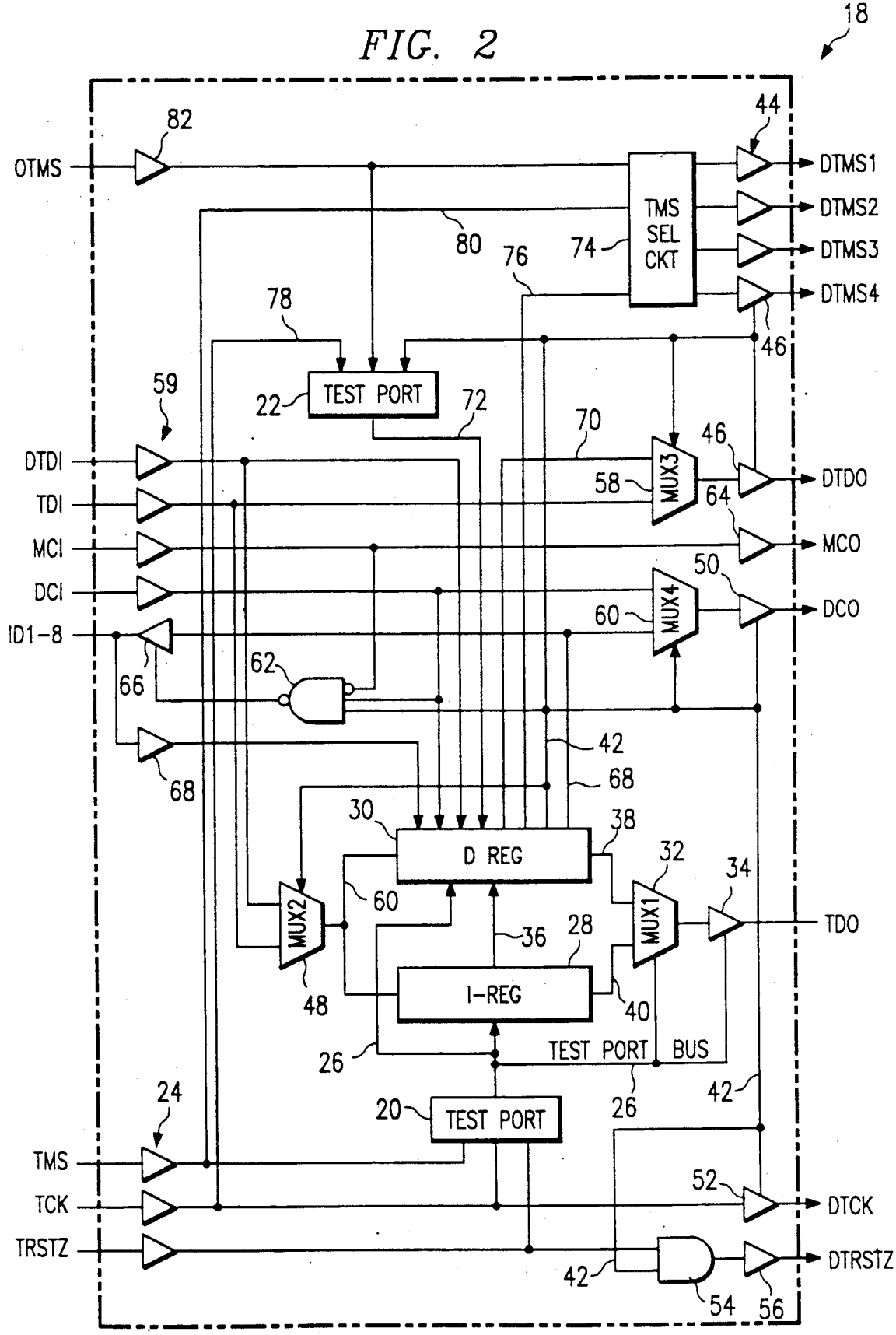

1

SYSTEM SCAN PATH ARCHITECTURE WITH REMOTE BUS CONTROLLER

RELATED APPLICATIONS

This application is related to co-pending application for U.S. patent Ser. No. 391,751, entitled "System Scan Path Architecture", by Whetsel, filed concurrently herewith.

TECHNICAL FIELD OF THE INVENTION

This invention relates in general to integrated circuits, and more particularly to a device for supporting selective scan access to multiple subsystems in a system design.

BACKGROUND OF THE INVENTION

The ability to test the functionality of devices in a system, and the connections between the devices, has become more important along with increased complexity of systems using one or more integrated circuit boards. While advances in board interconnect technology, such as surface mount packaging and integrated circuit (IC) gate density, have had a positive influence on the design of state-of-the-art electronic systems, they adversely affect system-level testability. The increased complexity of circuit boards makes it more difficult and costly for a manufacturer to test board designs using traditional testing techniques. One of the test areas which is critically affected by advance technologies is in-circuit testing. Conventional methods of in-circuit testing rely on the ability to physically access the board, using probing fixtures, to apply stimulus and measure response from the circuit under tests. However, as board layouts become denser, the space allocated for probing is being reduced, and in some cases, deleted altogether.

Boundary scan is the application of a partitioning scan ring at the boundary of IC designs to provide controllability and observability access via scan operations. The application of a scan path (an interconnection of one or more scan devices interconnected such that serial data can be passed between the devices) at the boundary of integrated circuit designs provides an imbedded testing capability that can overcome the test access problems associated with complex board designs. More generally, serial scan testing allows observation and control of isolated nodes attached to serially connected nodes.

In a complex system, it is desirable to partition the boards into a plurality of scan paths which may be accessed either individually or in conjunction with one another. Heretofore, in order to gain access to one of the scan paths in each board design, the primary bus master would need a number of output signals equal to the sum of the total scan paths of each board in the system. For example, in a system with N board designs, with each board having m selectable scan paths, the primary bus master must have a number of output signals equal to mN. Hence, a system with twenty boards, with each board having five individually selectable scan paths, the total number of output signals required from the primary bus master would require one hundred IC package pins, along with additional package pins for clock and data input/output signals.

Furthermore, prior art systems do not provide for an inherently fault tolerant scan path networking scheme. Thus, if an open circuit or short circuit fault condition were to occur on one of the scan paths, the operation of the entire system scan path would be disabled.

Another problem associated with the prior art is that it has not addressed the capability of allowing either a primary or remote test bus master device to select and shift data through any one of the secondary scan paths.

Therefore, a need has arisen in the industry to provide apparatus capable of selecting or deselecting secondary scan paths onto a primary scan path to customize the total length of the primary scan path for a particular scan operation. Furthermore, the apparatus should provide fault tolerance and the ability to select primary and remote test bus masters.

SUMMARY OF THE INVENTION

In accordance with the present invention, a serial-scan testing circuit and method is provided which substantially eliminates disadvantages associated with the prior art.

The circuitry for performing serial-scan testing of the present invention includes a primary bus controller for transmitting test signals on a primary test bus to a plurality of predefined circuits. Each predefined circuit includes a plurality of secondary scan paths which may be selectively coupled to a primary scan path through device select modules associated with respectively predefined circuits. Remote bus controllers associated with respective device select modules are operable to perform serial-scan testing on the associated predefined circuit independent of the primary bus controller. Typically, the predefined circuits comprise circuit boards coupled to the primary bus; however, the architecture of the present invention could be used to test, for example, different circuits on an integrated circuit device.

The present invention provides the advantage that the remote bus controller may handle local test and scan operations at the circuit level, allowing the primary bus controller to handle higher level system tasks, such as fault logging, system diagnostics, and interfacing to the outside world. Also, system test time is reduced since multiple distributed remote bus masters can execute local subsystem testing concurrently, as compared to sequencing through each local subsystem consecutively via the primary bus controller.

In another aspect of the present invention, the remote bus controller comprises a processor to execute task programs stored in a local memory. A test bus controller transmits and receives serial data and control on a parallel bus which is coupled to the remote bus controller and its associated device select module. The test bus controller includes a flip flop to provide a scan bypass path when the remote bus controller is disabled.

In yet another aspect of the present invention, the remote bus controller and the device select module may be selectively disabled from the parallel bus using tri-state devices. Selected lines of the parallel bus are connected to pull-up and pull-down resistors which provide an identifying code on the parallel bus while neither the remote bus controller nor the device select module is outputting data to the parallel bus. The primary bus controller and the remote bus controller may communicate through the parallel bus and through interrupt circuitry coupled between the two controllers.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 illustrates a circuit block diagram of the device select module;

DETAILED DESCRIPTION OF THE INVENTION

The preferred embodiment of the present invention is best understood by referring to FIGS. 1-9 of the drawings, like numerals being used for like and corresponding parts of the various drawings.

Figure 1:
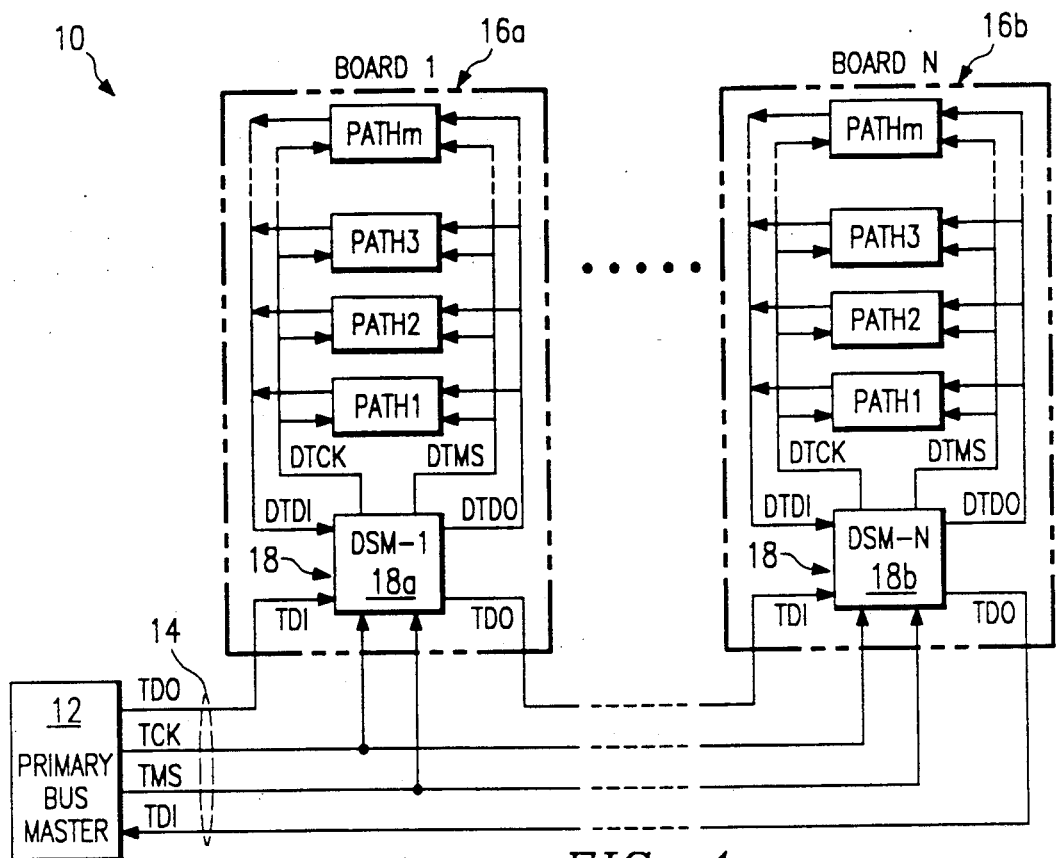
FIG. 1 illustrates a circuit block diagram of a system-level scan path architecture.

FIG. 1 illustrates a circuit block diagram of a system-level scan path architecture 10. A primary bus master 12 is connected to a test bus 14 having four test bus signals: a test clock (TCK) signal for clocking serial data through a scan path, a test mode select (TMS) signal for test and scan control, a test data input (TDI) signal for inputting serial data into a scan path, and a test data output (TDO) signal for outputting serial data from a scan path. The test bus 14 is connected to a plurality of circuit boards, two of which 16a-b, are shown. Each circuit board comprises a respective device select module (DSM) 18a-b. The TDO output of the primary bus master 12 is connected to the TDI input of the first DSM 18a. The TDO output of the DSM 18a is connected to the TDI input of the DSM of the next board on the bus. In other words, the DSMs 18 of the respective boards are connected in daisy-chain fashion through their TDI and TDO ports. The TDO of the DSM 18b of the last board in the chain is connected to the TDI input signal of the test bus 14. The TCK signal of the test bus 14 is connected to the DSM 18 of each board, as is the TMS signal.

The DSM 18 of each board outputs a device test data output (DTDO) signal to a plurality of subsystems, or "secondary scan paths." The individual scan paths of each board are denoted PATH1 through PATHm. Each of the secondary scan paths PATH1-m, outputs a signal which is connected to the device test data input (DTDI) of the DSM 18 of the respective board. The DSM 18 also outputs a device test clock (DTCK) signal which is connected in parallel to each of the secondary scan paths and outputs a plurality of device test mode select (DTMS) signals, each of which is connected to a respective secondary scan path. In other words, DTMS(1) is connected to PATH1 and DTMS(m) is connected to PATHm.

In the preferred embodiment, the test bus of FIG. 1 is compatible with the IEEE Standard 1149.1 proposed standard.

In operation, the DSMs 18 of the respective boards 16 may be configured by the primary bus master 12 to select one of the scan paths (1 through m) on their respective boards, or to bypass the secondary scan paths entirely. By selecting or deselecting secondary scan paths onto the primary scan path, it is possible to customize the total length of the primary scan path to include only the required secondary scan paths for a particular scan operation. This ability results in a reduction in the time required to scan data through a user specified configuration of primary and selected secondary scan paths, since the serial data and the clocks needed to shift the data through nonessential secondary scan paths can be eliminated. The ability to traverse a system scan path configuration in the shortest possible time period results in a reduction in the overall test time of the system, which is reflected in a lower system test and maintenance cost.

When a secondary scan path is selected, the primary scan path is routed from the TDO output of the primary bus master 12 to the TDI input of the DSM 18, through the DSM 18 to its DTDO output, through the selected device scan path, and back to the DSM 18 via the DTDI input to the DSM, through the DSM to the TDO output, and back to the TDI input of the primary bus master 12. If a device scan path is not selected, the primary scan path is routed from the TDO output of the primary bus master 12 to the TDI input of a DSM 18, through the DSM 18 to its TDO output, and routed back to the TDI input of the primary bus master 12.

By using the DSMs 18 to design the system scan path architecture, as shown in FIG. 1, a primary bus master 12 with only a single TMS output signal can gain individual access to each scan path (PATH1,2,..m) of each board design (1,2,..N) in the system. This is possible because the DSMs 18 contain internal switches that can be set by a command shifted into an individual DSM 18 from the primary bus master 12 to couple the primary TMS input signal up to one of the selectable device scan paths via one of the DTMS output signals, (DTMS1, DTMS2, ... DTMSn). This results in a scan path selection system requiring only a single TMS output pin from the primary bus master IC and minimum 4-wire system test interface cable and connector bus width to accommodate the IEEE standard test bus signals: TCK, TMS, TDI, and TDO.

In addition to its ability to maintain a minimum test interface to the system being tested, the DSMs 18 provide the basis for an inherently fault tolerant scan path networking scheme. In FIG. 1, it is seen that the DSMs 18 buffer all signals between the primary and selectable secondary scan paths. This buffering action isolates faults that could occur in one or more of the device's scan paths from having an adverse affect on the primary scan path.

For example, if an open circuit or short-to-ground fault condition were to occur on any of the secondary scan path output signals (DTMS, DTCK, DTDI, or DTDO) the shifting of serial data into the secondary scan path would be inhibited. Faults of this nature could be tolerated until repaired by simply deselecting the faulty board from the primary scan path so that the primary scan path only passes through the DSM from the TDI input to the TDO output. In this way, the faulty section in the system's scan path network is effectively bypassed so that scan access is maintained to other scan paths in the system.

Another advantage of the DSM 18 is that it may be provided with a dual port test bus interface which allows either a primary or remote test bus master device to select and shift data through any one of its secondary scan paths. To facilitate the graceful switching of test bus control between primary and remote bus masters, as well as the transfer of data and control, the DSM may incorporate interrupt pins and a bidirectional data bus. In addition, a special communications protocol has been defined that allows simple and efficient transfer of information between primary and remote test bus masters. This aspect of the invention is described in greater detail in connection with FIGS. 6-9.

It should be noted that although the present invention is described herein in connection with a test bus connected to a plurality of boards, it could be used in connection with any predefined circuits having scan paths defined therethrough. For example, the circuits defined by boards 16a-b could be formed on a single integrated circuit, along with the DSMs 18, test bus 14 and primary bus master 12.

FIG. 2 illustrates a block diagram of the architecture of the DSM 18. The DSM 18 comprises two test ports 20 and 22. The primary test port 20 is connected to the TMS and TCK signals of the test bus 14 along with a external test reset signals (TRSTZ) input for initialization purposes. The TMS, TCK and TRSTZ signals are input to the primary test port 20 via buffers 24. A test port bus 26 is connected to an instruction register (I-REG) 28, a data register (D-REG) 30, to the select port of a first multiplexer (MUX1) 32 and to the enable port of a tristate buffer 34.

DSM ARCHITECTURE

The I-REG 28 is connected to the D-REG 30 through signal line 36. D-REG 30 and I-REG 28 output signals to the first multiplexer 32 over signal lines 38 and 40, respectively. The output of the first multiplexer 32 is passed to the TDO signal of the DSM via tristate buffer 34.

The D-REG 30 outputs a control bus 42 connected to the enable ports of tristate buffers 44 which output the DTMS signals, the enable port of a tristate buffer 46 which outputs the DTDO signal, the remote test port 22, the select port of a second multiplexer (MUX2) 48, the enable port of a tristate buffer 50 which outputs the DCO (Device Condition Output) signal, the enable port of a tristate buffer 52 which outputs the DTCK signal, and to the input of an AND gate 54. The TRSTZ signal is connected to the other input of the AND gate 54; the output of AND gate 54 is coupled with the DTRSTZ signal through buffer 56. The TCK signal is connected to the input of buffer 52. The control bus 42 is also connected to the select port of a third multiplexer (MUX3) 58 and the select port of a fourth multiplexer (MUX4) 60.

The DTDI, TDI, MCI and DCI signals are input to the DSM 18 via buffers 59. The TDI signal is also connected to the MUX3 58. The MCI signal is connected to an inverted input of a NAND gate 62 and to the MCO output via buffer 64. The DCI signal is connected to an input of an NAND gate 62 and to the input of MUX4 60. The DCI signal is also connected directly to the D-REG 30. The control bus 42 is connected to the third input of NAND gate 62, the output of which is connected to the enable port of a tristate buffer 66. Signal line 68 from the D-REG 30 is connected to a second input to MUX4 60 and to the input of the tristate buffer 66. The output of tristate buffer 66 is connected to the ID1-8 signal bus and to the D-REG via buffer 68. The output of MUX4 is connected to the DCO output via tristate buffer 50. Signal line 70 is output from the D-REG 30 to the second input of MUX3 58. The output of MUX3 58 is connected to the DTDO signal via buffer 46. D-REG 30 is connected to remote test port 22 via signal line 72. D-REG 30 is connected to a TMS selected circuit 74 via signal line 76. The TCK signal is connected to the remote test port 22 via signal line 78. The TMS signal is connected to the TMS select circuit 74 via signal line 80. The OTMS signal is input to the TMS circuit 74 and to the remote test port 22 via buffer 82. The TMS circuit 74 outputs the plurality of DTMS signals (DTMS1-4) via buffers 44. The DTDI and TDI signals are connected to the inputs of MUX2 48, the output of which is connected to the D-REG 30 and I-REG 28 over signal line 60. The DTDI signal is also connected directly to the D-REG 30.

The basic architecture is consistent with the generalized architecture of the proposed P1149.1 IEEE standard in that it has a 4-wire test bus input (TCK, TMS, TDI, TDO) and parallel access to an internal instruction register (I-REG 28) and a data register (D-REG 30). When control is input on the 4-wire test bus to the primary test port 20, the primary test port 20 responds to shift data through either the I-REG or D-REG from the TDI input to the TDO output.

PRIMARY TEST PORT 20

The primary test port 20 is a controller which receives external input from the primary scan path TCK and TMS input signals. It also receives input from an external test reset (TRSTZ) input for initialization purposes. The primary test port 20 outputs control via bus 26 to load and shift data through either the I-REG 28 or one of the shift registers in the D-REG 30 (see FIG. 3). When control to load and shift data is issued, the selected path, I-REG 28 or D-REG 30, will shift data from the serial output 60 of MUX2 48 to the TDO output of the DSM.

REMOTE TEST PORT 22

The remote test port 22 is a controller which receives external input from a remote bus master via the optional TMS input (OTMS) and from the primary TCK input. It also receives an internal control input signal from the D-REG 30 via bus 42 to enable or disable its operation. When enabled, remote test port 22 responds to the OTMS input signal and outputs control via bus 72 to shift data from the DTDI input signal, through the Select register in the D-REG 30 (See FIG. 3), to the DTDO output signal, via MUX3 58 and D-REG output signal line 70.

I-REG 28

The I-REG 28 is a shift register comprising a series of scan cells. The I-REG 28 is used to store instructions executed by the DSM 18. The I-REG 28 receives control input from primary test port 20 via bus 26 and serial data input from MUX2 48 via signal line 60. The I-REG outputs control via bus 36 to the D-REG 30 and serial data to MUX1 via signal line 40.

D-REG 30

Figure 3:
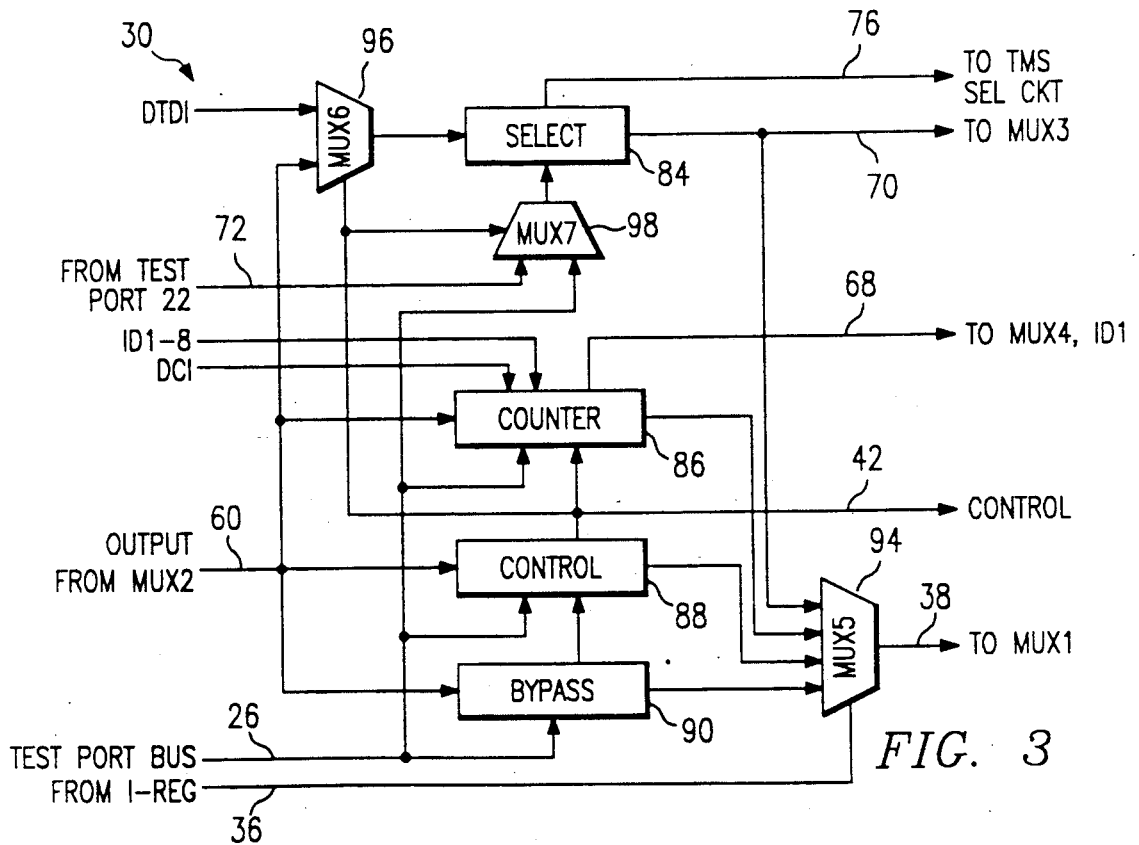
FIG. 3 illustrates a circuit block diagram of the data register (D-REG) of the device select module.

The D-REG 30 comprises four internal scan paths arranged in parallel between the serial data output from MUX2 48 and the serial data input line 38 to MUX1 32 (see FIG. 3). The D-REG 30 receives input from primary test port 20 via bus 26, remote test port 22 via bus 72, I-REG 28 via bus 36, external identification inputs (ID1-8) from bus via buffers 68, serial data input from the DTDI signal and from MUX2 output signal 60, and an external device condition input (DCI). The D-REG 30 outputs control on bus 76 to the TMS select circuit 74 and from bus 42 to MUX2 48, MUX3 58, and MUX4 50, the AND gate 54, the NAND gate 62, and to the tristate output buffers 44, 46, 50 and 52. The D-REG 30 outputs data and status signals on bus 68 to the ID1-8 output buffers 66 and MUX4 60, respectively. The D-REG outputs serial data to MUX3 58 via signal line 70.

In FIG. 3, a detailed view of the D-REG 30 is shown. The D-REG 30 comprises four separate scan path registers: Select 84, Counter 86, Control 88, and Bypass 90 registers. These registers are arranged in parallel between the serial data input signal 60 from MUX2 48 and the serial data output signal 38 from a fifth multiplexer (MUX5) 94. Control input from the I-REG 28 on bus 36 selects the serial output of one of the four registers to be coupled up to the output signal 38 of MUX5 94. Control input from the primary test port 20 on bus 26 selects one of the four registers to load and shift data from the serial input 60, through MUX5 94, to the serial output 3B. An additional control input bus 72 from remote test port 22 is input to the D-REG 30 and is used to shift data through the Select register 84 when a remote test bus master has been enabled to access the device scan paths via the DTMS1-4 DTDI, and DTDO device scan path signals. The decision of whether remote test port 22 is enabled to access the device scan paths is made by the primary test bus master.

D-REG—BYPASS REGISTER SCAN PATH

The purpose of the Bypass register 90 is to provide a shortened scan path through the D-REG 30. When selected, the bypass scan path couples the serial data input signal 60 up to the serial data output 38 of MUX5 94 through a single scan cell. This bypass feature is consistent with the proposed P1149.1 IEEE standard. Control to shift data through this scan path comes from the primary bus master 12 via primary test port 20 and test port bus 26.

D-REG—CONTROL REGISTER SCAN PATH

The purpose of the control register 88 is to provide storage for control bits used to: (1) set up the mode of operation of the counter register, (2) enable or disable the remote test port 22 to shift data through the select register 84 and device scan paths, (3) select the serial data input (either from bus 60 or from the DTDI and signal) to the select register 84 via a sixth multiplexer (MUX6) 96, (4) select which input to MUX4 (see FIG. 2) is to be coupled up to the DCO output signal, (5) control the tristate condition of the device outputs (DTMS1-4, DTDO, DCO, and DTCK), and (6) to issue a reset condition onto the device reset output signal DTRSTZ via the AND gate 54. Control to shift data through this scan path comes from the primary bus master via primary test port 20 and bus 26.

D-REG—COUNTER SCAN PATH

The purpose of the counter register 86 is to provide a programmable counter function to be used to count the number of inputs received on the DCI input signal. In addition to its counting capability, the counter 86 can be used to input and output data on the bidirectional ID1-8 bus. In the data input mode, primary test port 20 can issue control via bus 26 to cause the counter 86 to read the external data input on the ID1-8 bus and shift it out for inspection. In the output mode the counter can output data, which has been shifted in from the primary scan path via primary test port 20, from the ID1-8 bus via internal bus 68 to an external device such as a remote test bus master IC.

The counter function can be programmed to count up or count down. In the count down mode, the counter can be set up to halt counting when a count of zero is reached, or continue counting passed the zero count. The count down mode is used to count down from a predetermined expected number of DCI inputs. When the zero count is reached, the counter can output a signal on the DCO output via MUX4 60 and bus 68 (FIG. 2) to indicate to the test bus master 12 that the zero count has been reached.

In the count up mode, the counter can be used to count an unknown number of DCI input pulses. At the end of the count up operation, the primary bus master can shift out the count value to determine the number of DCI input pulses that were counted. When a maximum count up value is reached the counter can output a signal on the DCO output via MUX4 60 and bus 68 to indicate the primary bus master 12 that a maximum count has been reached. The test bus master 12, upon receiving a maximum count up input signal, can increment an internal software or hardware counter to record the number of maximum count up signals the DSM has output. This action can be used to cascade the counter in the DSM with a larger counter in the primary bus master to extend the count up range. The counter can be adjusted to allow the count to be activated on either the rising or falling edge of the DCI input. The control to select which edge triggers the counter comes from control register 88 via bus 42.

D-REG—SELECT SCAN PATH

The select register 84 contains the control bits used to select the output condition of the four DTMS outputs (DTMS1-4 in the illustrated embodiment) from the TMS Select circuit 74. The select register 84 has two control bits for each DTMS1-4 output signal, to allow each output to be set to one of four possible output modes. In addition, the select register has an error detection logic section to insure that the control bit settings scanned into the select register enables only one DTMS output signal at a time to shift data through a selected device scan path. The output from this error detection logic is input to the TMS Select circuit from the select register via bus 76.

Normally, the select register 84 receives control from the primary test bus master 12 via primary test port 20 and bus 26 to load and shift data. However, the select register can also receive control to load and shift data from a remote bus master via remote test port 22 and bus 72. The primary bus master can select a remote bus master to access the select register by setting control bits in the control register. When a remote bus master is selected, the control bus 72 from remote test port 22 is input to the select register 84 in place of control bus 26 from primary test port 20, via a seventh multiplexer (MUX7) 98. During access by a remote bus master, serial data is input to the select register 84 from the DTDI input signal, and serial data is output from the select register 84 to MUX3 58 (FIG. 3) via signal line 70. While a remote bus master is selected to control the select register, the primary bus master cannot access the select register.

TMS SELECT CIRCUIT

Referring to FIGS. 2 and 3, the TMS Select circuit (TMS SEL) 74 provides the switching circuitry required to couple one of a device's scan paths up to the primary scan path. The TMS SEL circuit 74 receives input on bus 76 from the Select register 84 to select the output state of each of the four DTMS1-4 output signals. The TMS SEL circuit 74 also receives input from the primary scan path TMS signal and from an optional TMS (OTMS) signal. While the TMS SEL circuit 74 outputs control to four device scan paths via the DTMS1-4 output signals, any number of DTMS output signals could be implemented in the TMS SEL circuit 74 to access additional secondary device scan paths.

Figure 4:
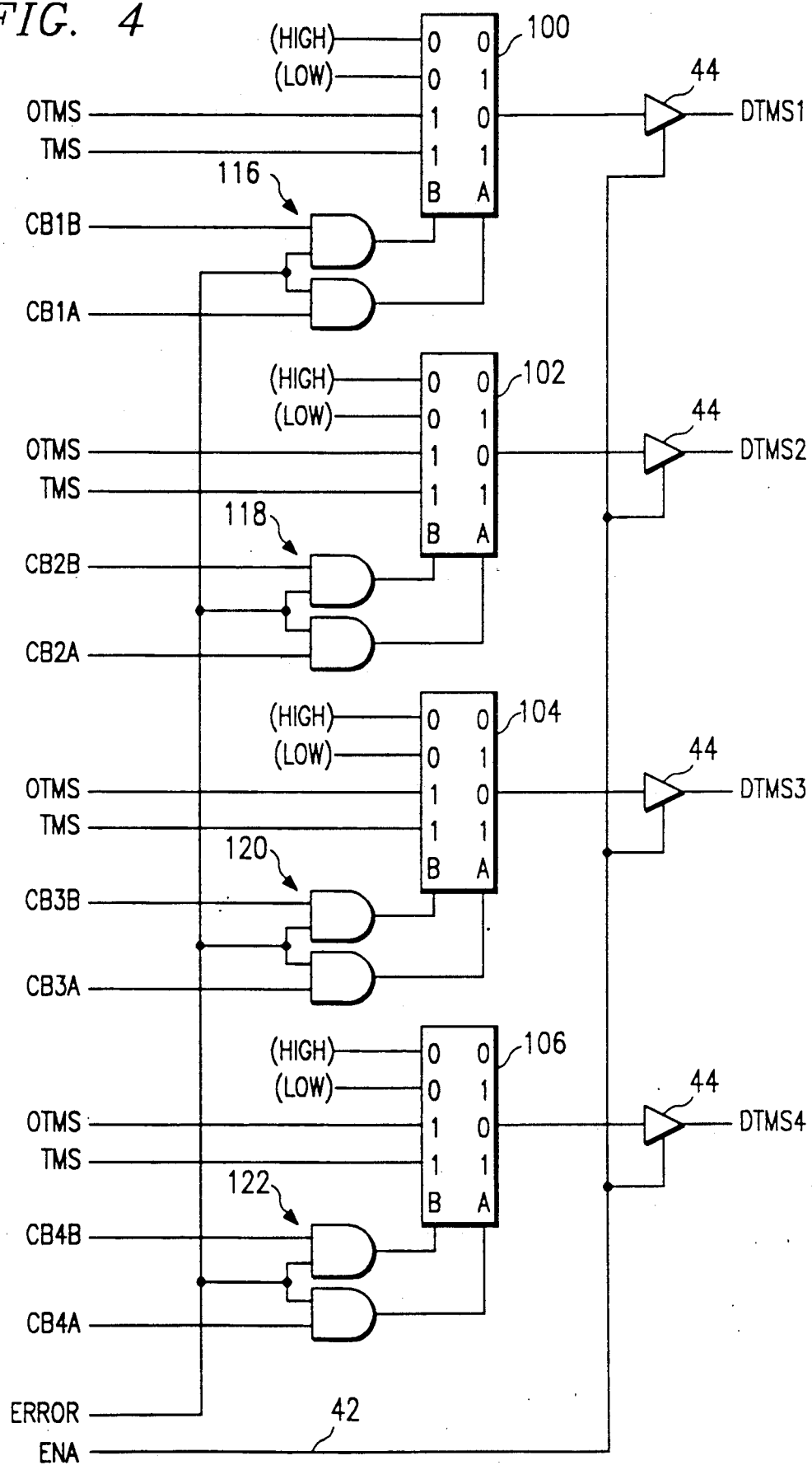
FIG. 4 illustrates a circuit diagram of the TMS select circuit of the device select module.

In FIG. 4, an example implementation of the TMS SEL circuit is shown. The circuit comprises four identically configured 4:1 multiplexers, 100, 102, 104 and 106. The output of each multiplexer drives a DTMS output (1-4) via a tristate buffers 44 (FIG. 2). Each 4:1 multiplexer 100-106 receives the same four input signals, a logic high input, a logic low input, the OTMS input signal, and the TMS input signal. Each multiplexer receives a unique pair of control bit inputs (CBxA and CBxB, x referring to the particular multiplexer) from the Select register via bus 76. Each multiplexer output is input to a respective tristate output buffer 44 to drive the DTMS1-4 signals out to the device scan paths. Tristate control for the output buffers is input from the Control Register 88 in the D-REG section via the enable signal on bus 42. The enable input from bus 42 can tristate the DTMS1-4 outputs as well as the DTDO and DTCK outputs (see FIG. 2) to allow another source, such as an external tester, to drive the scan paths attached to these outputs.

The control bit pairs (CBxA and CBxB) are input to each multiplexer 100-106 via a respective pair of AND gates 116, 118, 120 and 122. Each AND gate pair 116-122 also receives a low active error input from the Select register 84 via bus 76. The error input is used to force the multiplexer outputs, DTMS1-4, to a high logic level if more than one pair of control bit inputs are set to select more than one multiplexer to output OTMS or TMS scan control signals. Since the DSM 18 can only access one device scan path at a time, this error input prevents the DSM from selecting more than one device scan path if the control bits in the Select register 84 are set incorrectly.

If the control bit inputs to one of the multiplexers selects the high logic input to be output on the DTMSx output, the scan path attached to the DTMSx output signal will be set to a test logic reset state and the serial data output from the scan path is set to a high impedance state. In the test logic reset state, no scan or test operations can be performed in the scan path. The test logic reset state is one of the conditions defined for a scan path in the P1149.1 IEEE standard.

If the control bit inputs to one of the multiplexers selects the low logic input to be output on the DTMSx output, the scan path attached to the DTMSx output signal will be set to an idle state and the serial data output from the scan path is set to a high impedance state. In the idle state, the test logic in the scan path is enabled but no scan operations can be performed. The idle state is one of the conditions defined for a scan path in the proposed P1149.1 IEEE standard.

If the control bit inputs to one of the multiplexers 100-106 selects the TMS input from the primary scan path to be output on the DTMSx output, the scan path attached to the DTMSx output signal will perform the scan operation input on the TMS control signal. When TMS input is output on DTMSx, the device scan path will shift data during each DTCK clock output from the DSM's DTDO output, through the scan path, to the DSM's DTDI input (FIG. 1). During scan operations, the serial data output of the scan path is active to output data to the DTDI input of the DSM 18. While one DTMSx is outputting TMS control signals, all other DTMSx outputs must be set to either a high or low logic level. The scan operation performed conforms to the protocol established in the proposed P1149.1 IEEE standard for scanning data through a scan path.

If the control bit inputs to one of the multiplexers selects the OTMS input from an external test bus controlling source to be output on the DTMSx output, the scan path attached to the DTMSx output signal will perform the scan operation input on the OTMS control signal. When OTMS input is output on DTMSx, the device scan path will shift data during each DTCK clock output from the DSM's DTDO output, through the scan path, to the DSM's DTDI input (FIG. 1). During scan operations, the serial data output of the scan path is active to output data to the DTDI input of the DSM. While one DTMSx is outputting OTMS control signals, all other DTMSx outputs must be set to either a high or low logic level. The scan operation performed conforms to the protocol established in the proposed P1149.1 IEEE standard for scanning data through a scan path.

DCO MUX4

Figure 5:
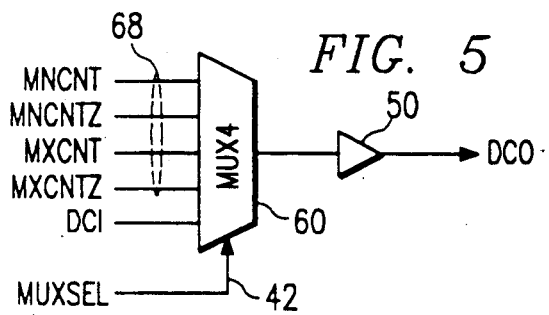
FIG. 5 illustrates a circuit diagram of a multiplexer used in the device select module.

In FIG. 5, an example implementation of the DCO output through MUX4, is shown. MUX4 receives control on bus 42 from the Control register 88 of the D-REG 30 to select one of five inputs to be output on the DCO output signal pin. During count down operations of the Counter register 86 of the D-REG 30, the DCO output can output the counter's minimum count value (MNCNT), its complement (MNCNTZ), or the DCI input which clocks the counter. During count up operations of the Counter register 86, the DCO output can output the counter's maximum count value (MUXCNT), its complement (MUXCNTZ), or the DCI input which clocks the counter.

ID1-8 OUTPUT BUFFER CONTROL NAND GATE

Referring again to FIG. 2, the NAND gate 62 is used to enable the output buffers on the ID1-8 bus to output data to an external device. Normally, the NAND gate 62 will be set so that the ID1-8 bus pins are configured to be inputs only so that an identification code can be input to the DSM for identification purposes. The NAND gate 62 receives the complement input from the MCI input signal, the DCI input signal, and an enable output control signal from the Control register 88 of the D-REG 30 via bus 42. The NAND gate 62 outputs tristate control signal to the output buffers 66 of the ID1-8 bus pins. If MCI is low, DCI is high, and the enable control bit is high, then the ID1-8 output buffers are enabled to output the data present in the Counter register 86 to the D-REG 30.

DSM INSTRUCTIONS

COUNTER REGISTER SCAN INSTRUCTION

During this instruction the Counter register 86 of the D-REG 30 is selected by the instruction register output bus 36 to receive control from the primary test port 20 to load and then shift data from the serial data output from MUX2 signal line 60 to the TDO output of the DSM 18. During the load operation the Counter register 86 loads the data input on the ID1-8 input bus. This instruction is used to read the data input to the ID1-8 bus.

COUNTER REGISTER READ INSTRUCTION

During this instruction, the Counter register 86 of the D-REG 30 is selected by the instruction register output bus 36 to receive control from the primary test port 20 to load and then shift data from the serial data output 60 of MUX2 48 to the TDO output of the DSM 18. During the load operation the Counter register 86 remains in its present state. This instruction is used to read the count value in the Counter register 86.

SELECT REGISTER SCAN INSTRUCTION

During this instruction, the Select register 84 of the D-REG 30 is selected by the instruction register output bus 36 to receive control from the primary test port 20 to load and then shift data from the serial data output 60 of MUX2 48 to the TDO output of the DSM 18. During the load operation the Select register 84 remains in its present state. This instruction is used to set the DTMS control bits input to the TMS SEL circuit 74 to select the output mode of the four DTMS1-4 output signals. The output bus 76 from the select register is held in its present state during the load and shift scan operation. Following the scan operation, the select register outputs on bus 76 are updated with the new select data shifted into the select register. In this way, the control inputs CBxA and CBxB to multiplexers 100, 102, 104 and 106 of the TMS select circuit all change at the same time and are synchronous to the TCK clock input from test bus 14. This allows synchronous select and deselection of device scan paths via the DTMS1-4 output signals.

CONTROL REGISTER SCAN INSTRUCTION

During this instruction, the Control register 88 of the D-REG 30 is selected by the instruction register output bus 36 to receive control from the primary test port 20 to load and then shift data from the serial data output 60 of MUX2 48 to the TDO output of the DSM 18. During the load operation the Control register 84 remains in its present state. This instruction is used to set the control bits in the Control register 88 to set up the Counter register 86 for a particular mode of operation. Also, the Control register 88 has control bits for issuing a reset condition to the device on the DTRSTZ output signal, and for tristating the device scan control signals DTMS1-4, DTCK, DTDO as well as the DSM's device condition output (DCO) signal. In addition, the Control register 88 can be used to enable remote test port 22 to access the Select register 84 via bus 72 when external control is input on the OTMS signal. The output bus 68 of the control register is held in its present state during the load and scan operation. Following the scan operation, the outputs of bus 68 are updated with the new control data shifted into the control register. In this way, all control outputs switch at the same time and are synchronous to the TCK input on bus 14.

COUNTER ENABLE INSTRUCTION

When this instruction is loaded into the I-REG 28, the Counter register 86 is enabled to count up or down as determined by the control bit setting in the Control register scan path. The counter will increment or decrement during each DCI input pulse while enabled by this instruction.

BYPASS SCAN INSTRUCTION

During this instruction, the Bypass register 90 of the D-REG 30 is selected by the instruction register output bus 36 to receive control from the primary test port 20 to load and then shift data from the serial data output 60 of MUX2 48 to the TDO output of the DSM 18. During the load operation, the bypass register bit is set to a low logic level. This instruction is used to shorten the scan path through the D-REG 30 to only a single scan cell or flip flop.

DESCRIPTION OF OPERATION

Figure 6:
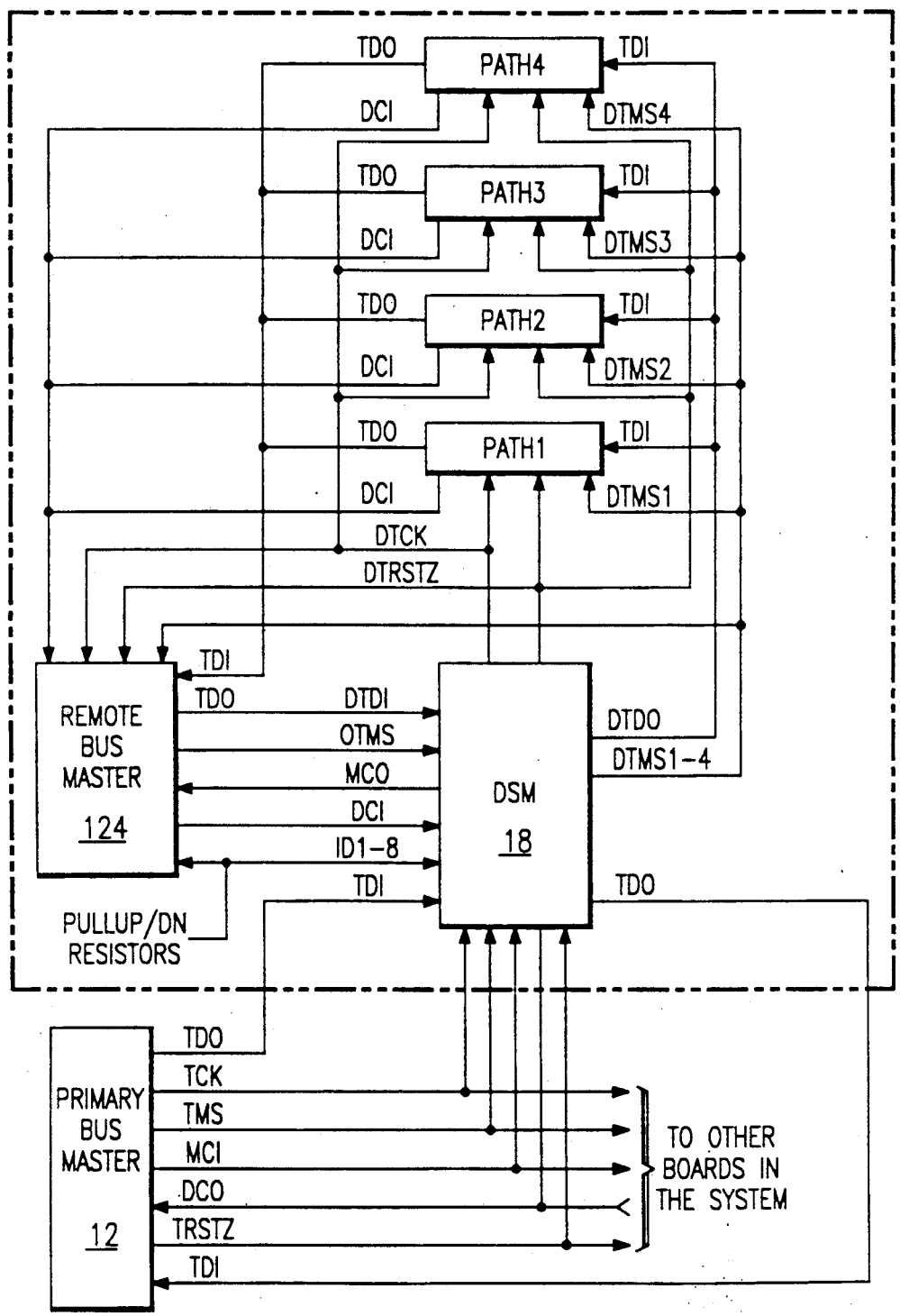
FIG. 6 illustrates a circuit block diagram of a typical board level implementation of the device select module used in conjunction with both primary and remote bus masters.

In FIG. 6, a typical board level implementation example of a DSM IC is shown. In the example, an optional remote bus master 124 is shown to exist on the board design a long with the DSM 18. The remote bus master 124 illustrates the DSM's dual port capability which allows a board resident remote bus master 124 to access the device scan paths in place of the primary bus master for scan and test operations. Also, FIG. 6 illustrates how a localized board level test controller like the remote bus master and the primary bus master controller can communicate with each other via the two interrupt signal paths (DCI/DCO and MCI/MCO) and the bidirectional ID1-8 bus. Communications via the interrupt and bidirectional bus allows the primary and remote bus masters 12 and 124 to maintain communications when the remote bus master 124 is controlling the test or scan operation on the board design. If this communications link were not available, the passing of data, status, and instruction between primary and remote masters, while the remote bus master is in control of the device scan paths, would be inhibited.

The circuit of FIG. 6 is essentially the same as the circuit of FIG. 1, with a few exceptions. The DTDI input of the DSM 18 is connected to the TDO output from the Remote Bus Master 124. The TDI input of the Remote Bus Master 124 is connected to the TDO outputs of the secondary scan paths. The Remote Bus Master 124 outputs OTMS and DCI signals to the DSM 18 and receives DTMS1-4, MCO, DTCK and DTRSTZ signals from the DSM 18. The ID1-8 bus provides bidirectional communication between the Remote Bus Master 124 and the DSM 18. The Remote Bus Master 124 also receives the DCI outputs from the secondary scan paths.

Referring to FIG. 6, the signals that connect the DSM to the primary scan path are divided up into three categories; Control, Data and Interrupt. The Control pins on the primary scan path are the TCK, TMS, and TRSTZ signals. The Data pins on the primary scan path are the TDI input and TDO output. The Interrupt pins of the primary scan path are the DCO output (Device Condition Output) and MCI input (Master Condition Input).

Similarly, the signals that interconnect the DSM to the device scan paths and remote bus master are divided up into the same three categories; Control, Data, and Interrupt. The Control pins on the device scan path are the DTCK, DTMS1-4 and DTRSTZ signals. The Data pins on the device scan path(s) are the DTDI input and DTDO outputs. The Interrupt pins on the device scan path are the DCI input (Device Condition Input) and MCO output (Master Condition Output).

The TCK and TMS control signals are output onto the primary scan path from the primary bus master. These signals are input to the DSM's primary test port 20 (FIG. 2) to cause serial data to be shifted from the primary test bus master, through the DSM scan path from the TDI input to the TDO output, and back to the primary bus master. The TCK and TRSTZ control signals are buffered and output from the DSM 18 via the DTCK and DTRSTZ outputs to control the device scan path circuitry.

When a device scan path is not selected, the serial data will enter the DSM 18 via the TDI input, pass through MUX2 48 (FIG. 2) and the D-REG or I-REG to be output from the TDO output, via MUX1 32. When not selected, the device scan paths and remote bus master are not affected by data being scanned through the DSM's internal scan path.

When a device scan path is selected, the serial data will enter the DSM 18 via the TDI input, pass through MUX3 58 (FIG. 2) to be input to the device scan path via the DTDO output. The serial data output from the DTDO output passes through the selected scan path then through the remote bus master before reentering DSM 18 via the DTDI input. While the remote bus master 124 is not enabled to be a master, it appears as a simple shift register in series with the selected device scan path. Serial data appearing at the remote bus masters TDI input from the TDO output of a selected scan path is clocked through the internal shift register during each DTCK input and is output on the remote bus master's TDO output pin, to be input to DSM 18 via the DTDI input. The shift register in the remote test bus master 124 can be used to pass information back and forth between the remote and primary bus master, while scan operations are controlled by the primary bus master. The TDO output from the remote bus master is input to the DSM 18 via the DTDI input. After entering the DSM, the data passes through MUX2 48 and the D-REG 30 or I-REG 28, to be output from the DSM 18 via the TDO output. It is important to note that the remote bus master is always in series with the selected scan path.

When one of the four DTMS outputs is selected, the device scan path attached to the selected DTMS output (FIG. 6) will operate synchronous to the DTCK clock output, which is sourced by the TCK clock input from the primary scan path. The selected DTMS1-4 output signal will transition with selected scan control input, TMS or OTMS, to shift data through the selected device scan path. The TMS SEL CKT 74 in FIG. 2 provides the circuitry for connecting or disconnecting one of the four DTMS outputs up to either the primary TMS or remote OTMS control input.

In the DSM example of FIG. 6 only four DTMS outputs are shown, however, any number of DTMS outputs could be implemented to support additional device scan paths. When one DTMS output is connected to either the TMS or OTMS input, the other three DTMS outputs will be set to either a high or low logic output state, to keep their scan paths inactive while the selected scan path is being shifted.

When the TRSTZ signal on the primary scan path goes low, the circuitry inside the DSM 18 will be initialized. After initialization, no device scan paths are selected and a scan operation issued from the primary test bus master will only pass through the DSM 18 from the TDI input to the TDO output, until the DSM 18 has been set up to select a device scan path. Also, the TRSTZ input signal is buffered and output to the device scan paths and remote bus master, via the DTRSTZ output signal, for initialization purposes. In addition, the DTRSTZ output signal can be set low by a control bit in the DSM's internal Control register 88 of the D-REG 30, to allow programmable resetting of a single associated device versus the global resetting of all devices using the TRSTZ input signal.

In FIGS. 2 and 6, it is seen that the DSM 18 has two unidirectional signal paths which can be used to provide an interrupt capability between the primary and remote bus masters 12 and 124. The primary bus master 12 may issue an interrupt to a remote bus master 124 by inputting a signal to the DSM's master condition input (MCI) pin. This signal is buffered and output to the remote bus master 124 via the master condition output (MCO) pin. Likewise, the remote bus master 124 may issue an interrupt to the primary bus master 12 by inputting a signal on the DSM's device condition input (DCI) pin. This signal is buffered and output to the primary bus master 12 via the device condition output (DCO) pin. Optionally, the DCO output pin can be set to output a maximum count up or minimum count down signal to the primary bus master 12 when the DSM's internal counter 86 is enabled. The counter 86 is clocked by device inputs on the DCI input. The DCI input can come from either the remote bus master 124 or from a selected device scan path via a multiplexer inside the remote bus master 124.

To provide for identification of different DSMs on the primary scan path, eight identification pins (ID1-8) are available. Once again, while eight pins were chosen for the illustrated embodiment, any number of pins could be implemented. The ID1-8 pins can be pulled high or low through external pull-up resistors to program the DSM's identity to be one of 255 possible binary IDCODEs. The all zeros binary code hexadecimal "00", (hereinafter OOH) is reserved for use in the DSM's communication protocol and cannot be used for identification purposes. The IDCODE input on the ID1-8 bus can be loaded into the DSM's internal counter register 86 and shifted out to the primary bus master 12 to identify the particular DSM 18 and board it is attached to.

In FIG. 6, it is seen that the DSM 18 has an optional TMS (OTMS) input which allows the remote bus master 124 to output control to shift data through one of the device paths, via OTMS control passed to a selected DTMS1-4 output, and through the internal Select register of the DSM, via OTMS control input to the internal remote test port 22 (FIG. 2). The primary bus master 12 can enable the remote bus master by setting internal control bits in the DSM's control register, followed by sending a message via the DSM interrupt pins and ID1-8 bus to the remote bus master to inform it that it has been given control to access the device scan paths.

In this configuration, the remote bus master 124 can output control on the OTMS signal to shift internally stored data from its TDO output to the DSM's DTDI input, through the DSM's internal select register to the DTDO output, through the selected device scan path, and back into the remote bus master 124 via its TDI input. Since the DSM's select register 84 is always in the remote test bus master's scan path, along with a selected device scan path, the remote bus master can adjust the select register's control bit settings to select any of the device scan paths. In this way the remote test bus master 124 can shift data through and apply a test on any of the device scan paths, in the exact same way as the primary bus master 12.

While the remote bus master 124 is shifting data through the DSM 18 from DTDI input, through the select register 84 to the DTDO output, the primary test bus master can be shifting data through the DSM 18 from the TDI input, through the I-REG 28 or D-REG 30 (except the select register) to the TDO output. Both the primary and remote scan operations are synchronous to the primary TCK input. Since the primary and remote bus masters shift data through different scan paths inside the DSM, they cannot communicate directly via scan operations. However, while remote and primary scan operations are being performed, the remote and primary bus masters can communicate together via a protocol established on the interrupt and ID1-8 bus pins to pass data, instruction, and status information between the two masters.

The advantage gained in delegating authority to the remote bus master 124 to handle local test and scan operations at the board (or subsystem) level is that it frees up the primary bus master 12 to handle higher level system tasks, such as fault logging, system diagnostics, and interfacing to the outside world. Also system test time is reduced since multiple distributed remote bus masters can execute local subsystem testing concurrently, as compared to having the primary bus master sequence through each local subsystem test one at a time.

COMMUNICATION PROTOCOL BETWEEN PRIMARY AND REMOTE BUS MASTERS

As shown in FIG. 6, the ID1-8 pins can be used as a bidirectional data bus between a remote and primary bus master. When used in this manner, the DSM 18 is set up to become a vehicle through which data can be transferred back and forth across the ID1-8 bus to facilitate communications between primary and remote bus masters 12 and 124. This mode of operation is enabled by setting a control bit in the DSM's internal Control register 88 scan path. This control bit is input via bus 42 to the NAND gate 62 to allow the ID1-8 bus to input and output data to and from the internal Counter register 86 when the appropriate protocols are input on the DCI and MCI interrupt pins.

Since an binary IDCODE, implemented via pull-up and pull-down resistors, and is not hardwired high or low, the output buffers from the remote bus master and from the DSM 18 can drive over the resistive loads on each ID1-8 pin to output data bidirectionally across the ID1-8 bus. It is important to note again that the IDCODEs have been defined to include any of the binary patterns from 01H to FFH, but exclude the 00H pattern. The reason for reserving the 00H binary pattern will be explained below.

Figure 7A:
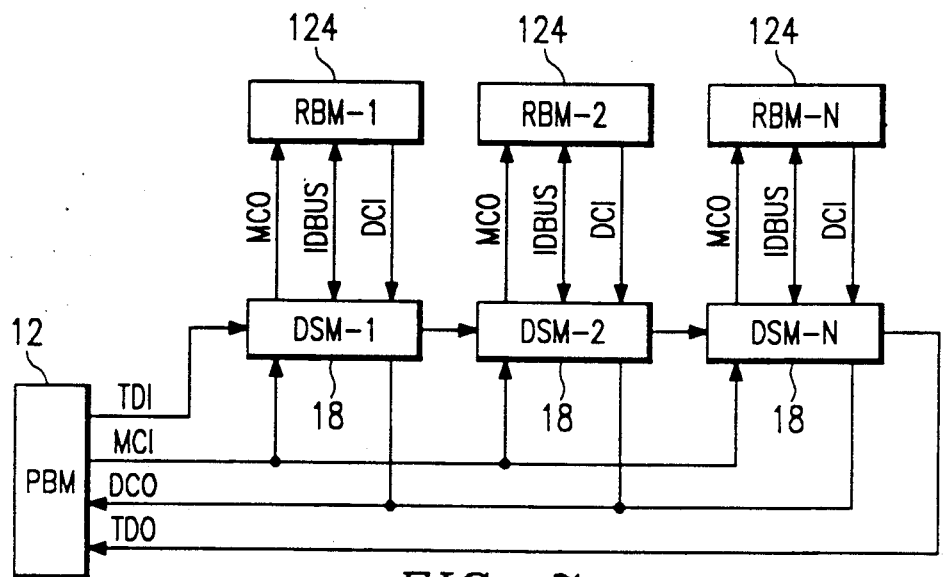
FIGS. 7a-c illustrate a circuit block diagram of local communication paths between the primary bus master and the remote bus master along with local handshake protocols therebetween.
Figure 7B:
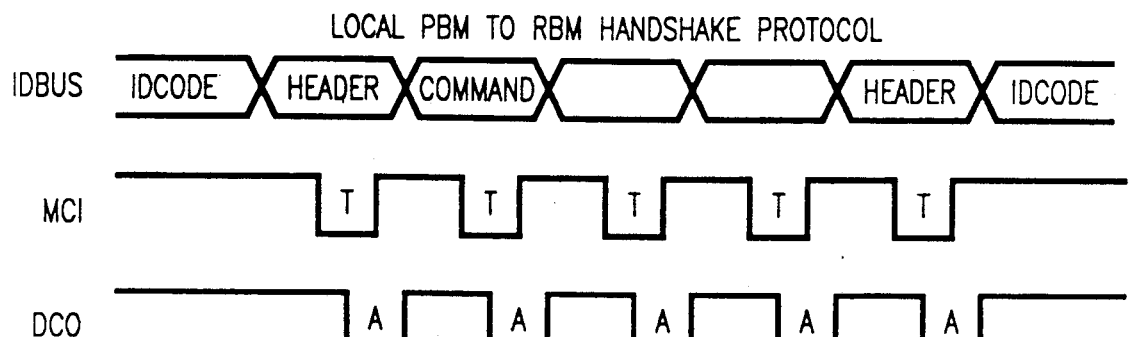
Figure 7C:
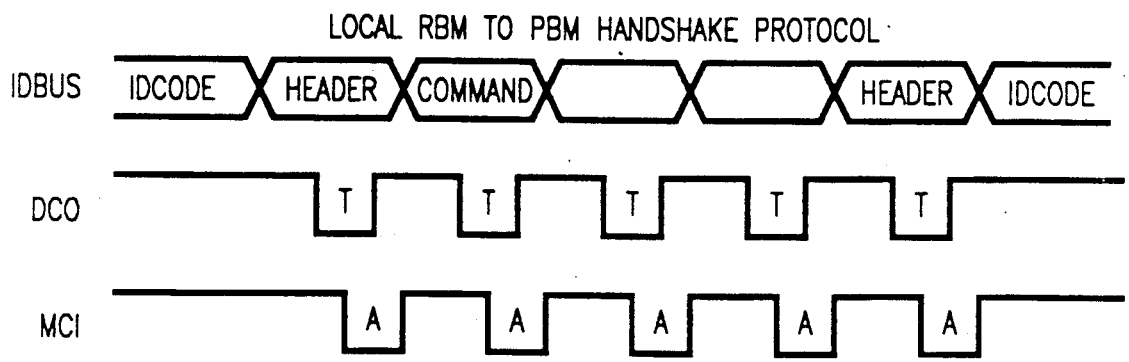
Figure 8A:
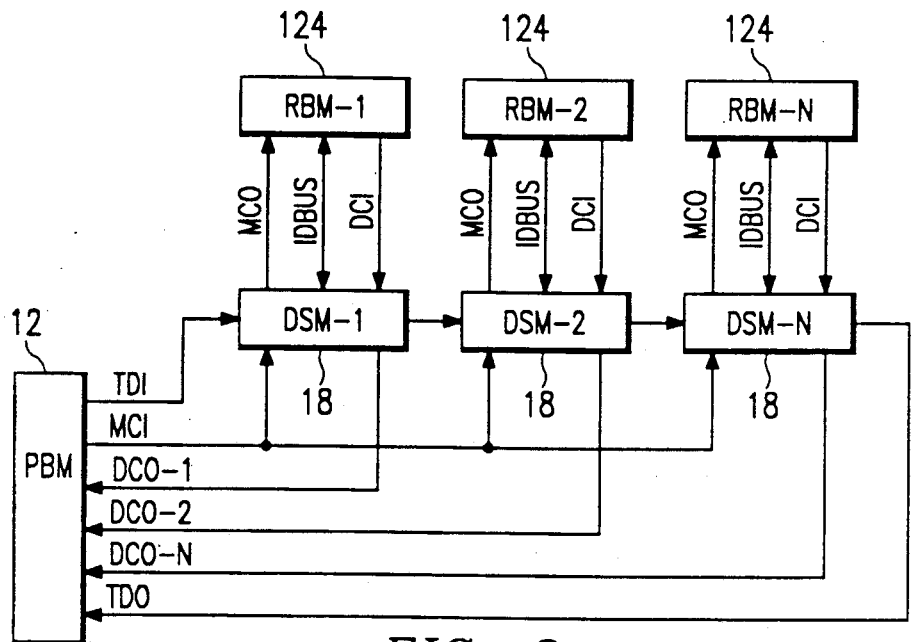
FIGS. 8a-c illustrate a circuit block diagram of global communication paths between the primary bus master and the remote bus master and global handshake protocols therebetween.
Figure 8B:
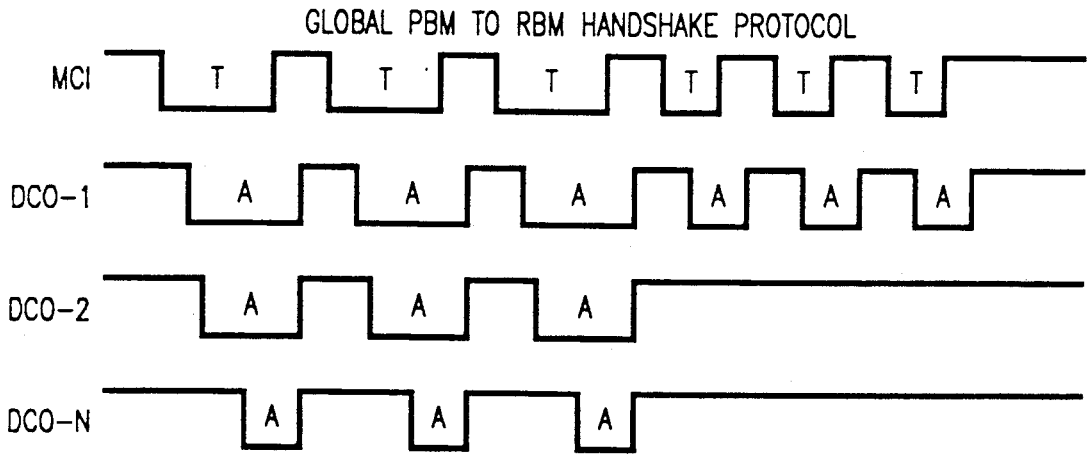
Figure 8C:
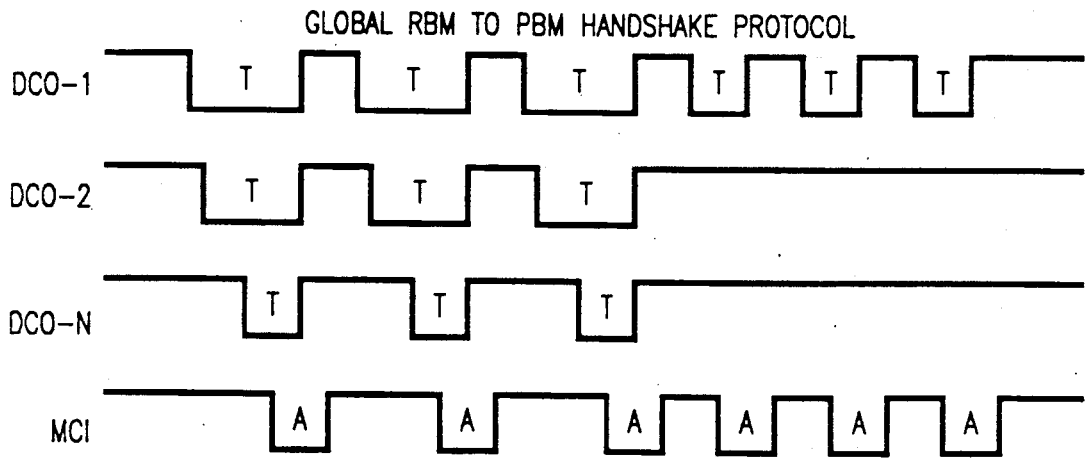

In FIGS. 7 and 8, example implementations are shown illustrating how a remote bus master (RBM) and a primary bus master (PBM) communicate together locally or globally using the DCI/DCO, MCI/MCO, and ID1-8 bus signals of the DSM IC. Also shown is the protocol timing defined on the MCI/MCO and DCI/DCO interrupt signal paths to produce a transfer (T) and acknowledge (A) handshake protocol between the PBM and RBMs. In the configuration shown in FIG. 7, the PBM 12 can only communicate with one RBM 124 at a time since only one DCO output from a DSM can be active to drive the wired OR bus inputting DCO signals into the PBM 12. In the configuration shown in FIG. 8, the PBM 12 can communicate concurrently with all RMBs since additional DCO inputs are provided on the PBM 12 to receive the individual DCO outputs from the DSMs 18. In either local or global communications protocols, the primary bus master always initiates the transfer of data. The remote bus master can respond to an initiated data transfer request but cannot initiate one itself.

LOCAL PBM TO RBM COMMUNICATION PROTOCOL

In the local PBM to RBM communication protocol timing in FIG. 7, the transfer of data from the PBM to one of the RBMs via a DSM is initiated by the PBM driving its MCI output to a low logic level. Prior to setting the MCI signal LOW, the PBM 12 will have shifted a protocol header pattern of 00H into a selected DSM's internal counter register (see FIG. 3), and enabled the DSM's ID1-8 output buffers to drive out the header pattern. Also, the DCO output buffer of the selected DSM 18 will be enabled, and all other DSM DCO outputs will be set to a disabled condition. In this way, the DCO output of the selected DSM can drive the wired DCO bus signal input to the PBM. The ID1-8 output buffers of the nonselected DSMs remain tristate to allow the IDCODE to remain on the ID1-8 bus.

The MCI signal output from the PBM 12 is routed through the DSMs and is input to the RBMs 124 via the MCO input signals. The low input on MCO indicates to the RBM the availability of data on the ID1-8 bus. When the RBMs sense the low on their MCO input, they read the data on the ID1-8 bus. The data read from the ID1-8 bus is inspected by each RBM to determine if it has been selected for a communications protocol operation.

If a RBM is not selected for a communications protocol, the data read from the ID1-8 bus will be equal to the external resistor driven IDCODE of the DSM, a particular binary value within the range of 01H to FFH. If the IDCODE is read, the RBM will take no further action based on the first received MCO input. However, the RBM will inspect the data on the ID1-8 bus after receiving subsequent MCO inputs to determine if it is still not selected.

If a RBM is selected for a communications protocol, the data read from the ID1-8 bus will be equal to the header pattern of OOH. If the RBM determines that the pattern read is equal to the protocol header of OOH, it will set its DCI output signal low to acknowledge back to the PBM that the header pattern has been read. It is for this reason that the OOH binary pattern is reserved from being decoded as an IDCODE pattern, to provide a method of determining if a RBM is selected for a communications protocol or not. The DCI output from the RBM passes through the DSM and is input to the PBM via the DCO input signal.

When the PBM 12 senses the low on the DCO input and acknowledges that the header pattern sent to the selected RBM 124 has been read, it sets its MCI output signal high. The RBM 124, after sensing the high logic level from the PBM 12 on the MCO input signal, sets its DCI output signal high. The PBM 12, after sensing the high logic level from the RBM 124 on the DCO input signal, shifts in a command pattern into the selected DSM's internal counter 86 and applies the command pattern out onto the ID1-8 bus. After the command is output, the PBM 12 and RBM 124 carry out the handshake protocol sequence on the DCI/DCO and MCI/MCO interrupt signals as described above for the header pattern, to transmit and acknowledge receipt of the command pattern.

The type of command sent from PBM to the RBM determines whether additional patterns are to be included in the communication protocol. If a command requires additional patterns to be sent, a count pattern will follow the command pattern to specify the number of additional pattern to be sent. The same protocol procedure is followed in sending any additional patterns as described in the transfer of the header and command patterns. The last pattern sent from the PBM 12 to the RBM 124 at the end of a communications protocol is the header pattern of OOH. After a RBM acknowledges receipt of the header pattern, the PBM 12 tristates the DSM's ID1-8 output buffers to allow the resistively driven IDCODE to be re-asserted onto the ID1-8 bus.

LOCAL RBM TO PBM COMMUNICATION PROTOCOL

In the local RBM 124 to PBM 12 communication protocol timing in FIG. 7, the transfer of data from a RBM 124 to the PBM 12 via the DSM is initiated by the RBM 124 driving its DCI output to a low logic level. Prior to the RBM 124 setting the DCI signal low, it will have enabled its output buffers to drive out a protocol header pattern of OOH onto the ID1-8 bus. The DCI signal is routed through the DSM 18 and is input to the PBM 12 via the DCO input signal. The low input on DCO indicates to the PBM 12 the availability of data on the ID1-8 bus. When the PBM 12 senses the low on the DCO input, it issues control to the DSM to load the counter register 86 with the pattern input on the ID1-8 bus, then shifts out the counter register 86 to inspect the pattern loaded.

The pattern read from the ID1-8 bus is inspected by the PBM 12 to determine if the header pattern has been sent. If the IDCODE has been read instead of the header pattern, the PBM 12 will assume the DCO input was a test related interrupt and not a request for communication. If this is the case, the PBM 12 will take the appropriate actions to determine the source of the interrupt. If the header pattern was read, the PBM 12 will set its MCI output signal low to acknowledge back to the RBM 124 that the header pattern has been received.

The MCI output from the PBM 12 passes through the DSM 18 and is input to the RBM 124 via the MCO input signal. When the RBM 124 senses the low on the MCO input and acknowledges that the header pattern sent has been read, it sets its DCI output signal high. The PBM 12, after sensing the high logic level from the RBM 124 on its DCO input signal, set its MCI output signal high. The RBM 124, after sensing the high logic level from the PBM on its MCO input signal, outputs a command pattern onto the ID1-8 bus. After the command is output, the RBM 124 and PBM 12 carry out the handshake protocol sequence on the DCI/DCO and MCI/MCO interrupt signals as described above with the header pattern to transmit and acknowledge receipt of the command.

The type of command sent from RBM 124 to PBM 12 determines whether additional patterns are to be included in the communication protocol. If a command requires additional patterns to be sent, a count pattern will follow the command pattern to specify the number of additional patterns to be sent. The same protocol procedure is followed in sending any additional patterns as described in the transfer of the header and command patterns. The last pattern sent from the RBM 124 to the PBM 12 at the end of a communications protocol is the header pattern of OOH. After a PBM acknowledges receipt of the header pattern, the RBM 124 tristates its ID1-8 output buffers to allow the resistively driven IDCODE to be re-asserted onto the ID1-8 bus.

GLOBAL PBM TO RBM COMMUNICATIONS PROTOCOL

In FIG. 8, an example is shown which supports a concurrent communications protocol between the PBM 12 and all the RBMs 124. Since the PBM 12 has multiple DCO inputs, a global handshake protocol operation can occur at the same time between the PBM 12 and RBMs 124. The data patterns transferred are identical in definition and format to the ones described in the local communications protocol, i.e., Header, Command, (Optional Data), Header.

In the global PBM 12 to RBM 124 communication protocol timing in FIG. 8, the transfer of data from the PBM 12 to the RBMs 124 is initiated by the PBM 12 driving its MCI output to a low logic level. Prior to setting the MCI output low, the PBM 12 will have scanned in a data pattern into each DSM 18 and caused the pattern to be output on the DSM ID1-8 bus. The MCI output signal from the PBM 12 passes through each DSM and is input to each RBM 124. In response to the MCO input, each RBM 124 will read the scanned in data pattern output on each DSMs ID1-8 bus, then set their DCI output low to acknowledge reading the data. Since all RBMs 124 may not necessarily acknowledge back at the same time, the DCO (1,2,N) output signals from the DSMs are shown to be skewed. When the PBM 12 sees that all RBMs 124 have acknowledged receipt of the data pattern sent, it sets its MCI output high. The RBMs 124 respond to the high signal on MCI by setting their DCI outputs high.

This protocol sequence describes one global transfer of data from the PBM 12 to each RBM 124. This protocol is repeated for each new data pattern that is to be sent globally to each RBM 124. In the timing example, it is shown that after the third data transfer, the communications protocol from the PBM 12 to RBMs 2 through N is completed, while the communications protocol, from the PBM to RBM1 continues for three additional data transfer operations. This is to illustrate that during a global communications protocol, data transfers between the PBM and each RBM can have different pattern transfer lengths.

GLOBAL RBM TO PBM COMMUNICATIONS PROTOCOL

In the global RBM to PBM communication protocol timing in FIG. 8, the transfer of data from each RBM 124 to the PBM 12 is initiated by the RBMs driving their DCI output to a low logic level. Prior to setting the DCI output low, each RBM 124 outputs a data pattern onto the ID1-8 bus to be input to the DSMs 18. The DCI output signals from the RBMs 124 pass through the DSMs 18 and are input to the PBM 12 via the DCO (1,2,N) inputs. Since each RBM 124 may not necessarily send the DCI output signals at the same time, the DCO (1,2,N) output signals from the DSMs are shown to be skewed. When all DCO (1,2,N) inputs are set low, the PBM 12 will perform a scan operation on the DSMs 18 to load and shift out the data pattern input on the ID1-8 buses. After the PBM 12 has read the data patterns, it will set its MCI output low to acknowledge reading of the data. The MCI signal is passed through the DSMs and input to the RBMs 124 via the MCO signal. When the RMBs 124 see the low on MCO, acknowledging that the PBM 12 has read the data patterns sent, they set their DCI output high. The PBM 12 responds to the highs on the DCO inputs from the RBMs 124 by setting its MCI signal high.

This protocol sequence describes one global transfer of data from the RBMs 124 to the PBM 12. This protocol is repeated for each new data pattern that is to be sent globally from each RBM 124 to the PBM 12. In the timing example it is shown that after the third data transfer, the communications protocol from RBMs 2 through N to the PBM 12 is completed, while the communications protocol from RBM 1 to the PBM continues for three additional data transfer operations. This is to illustrate that during a global communications protocol, data transfers between each RBM 124 and the PBM 12 can have different pa-tern transfer lengths.

COMMUNICATION PROTOCOL COMMANDS AND FORMATS

Two general types of data transfer formats are defined to be used with the communications protocol Command Only and Command with Data. The type of data transfer (Command only or Command with Data) is specified by the command pattern (second pattern) sent.

(1) Command Only Formats (Header) (Command) (Header)

The Command Only type of format comprises of a leading header pattern of OOH, followed by a command pattern, followed by a terminating header pattern of OOH, as shown above. The PBM uses this type of communications protocol format to issue command instructions to the RBMs. The Command Only type communication formats sent from a PBM 12 to one or more RBMs 124 can be used to: (1) request the RBMs to initiate a local test operation, (2) request the RBMs to send back data collected from a test operation, (3) request the RBMs to send back test status information on a test operation being performed, i.e., "Test In Progress" or "Test Complete," or (4) send an error message to one or more RBMs to indicate that it has received an unknown command. Also, the RBMs can use this communications format to send an error message back to the PBM 12, to indicate receiving an unknown command.

(2) Command With Data Formats (Header) (Command;
[(Count)(Data1-N)][(Count)(Data1-N)].. (Header)

The Command with Data type formats comprise of a leading header pattern, followed by a command pattern, followed by at least one count pattern and a corresponding number of data patterns, followed by a terminating header pattern. The count pattern specifies the number of data patterns that follow the count pattern. In this format the number of data patterns sent after the count pattern can be from 1 to 256, due to the eight-bit width of the ID1-8 bus. If more than 256 data patterns are to be sent, another count pattern between 1 and 256 is sent after the last data pattern of the previous count, to continue the data transfer operation. If no more data patterns are to be sent, the header pattern of OOH is sent after the last data pattern. The receiving device looks at the pattern following the last data pattern to see if it is equal to the header (OOH) or a count pattern (1-256) to determine whether to stop receiving data. The PBM issues this type of communication format when it is transferring a series of data, status, or instruction patterns to one or more of the RBMs 124. The RBMs issue this type of communications format, when requested by the PBM 12, to transfer data, status, or instructions back to the PBM 12.

VERTICAL AND HORIZONTAL EXPANSION OF DSM ICS

Figure 9:
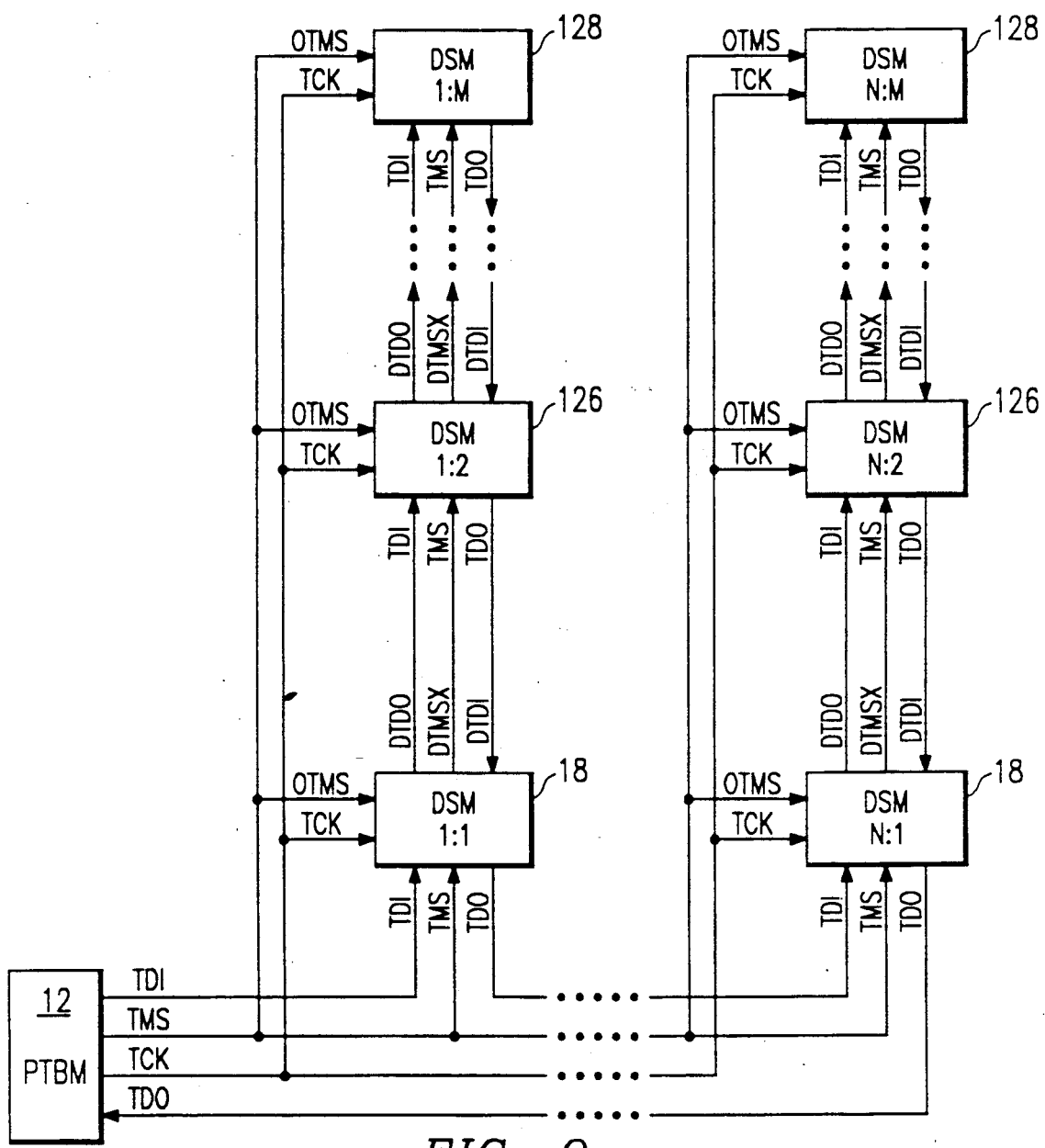
FIG. 9 illustrates a circuit block diagram of secondary scan paths using multiple device select modules.
Figure 10:
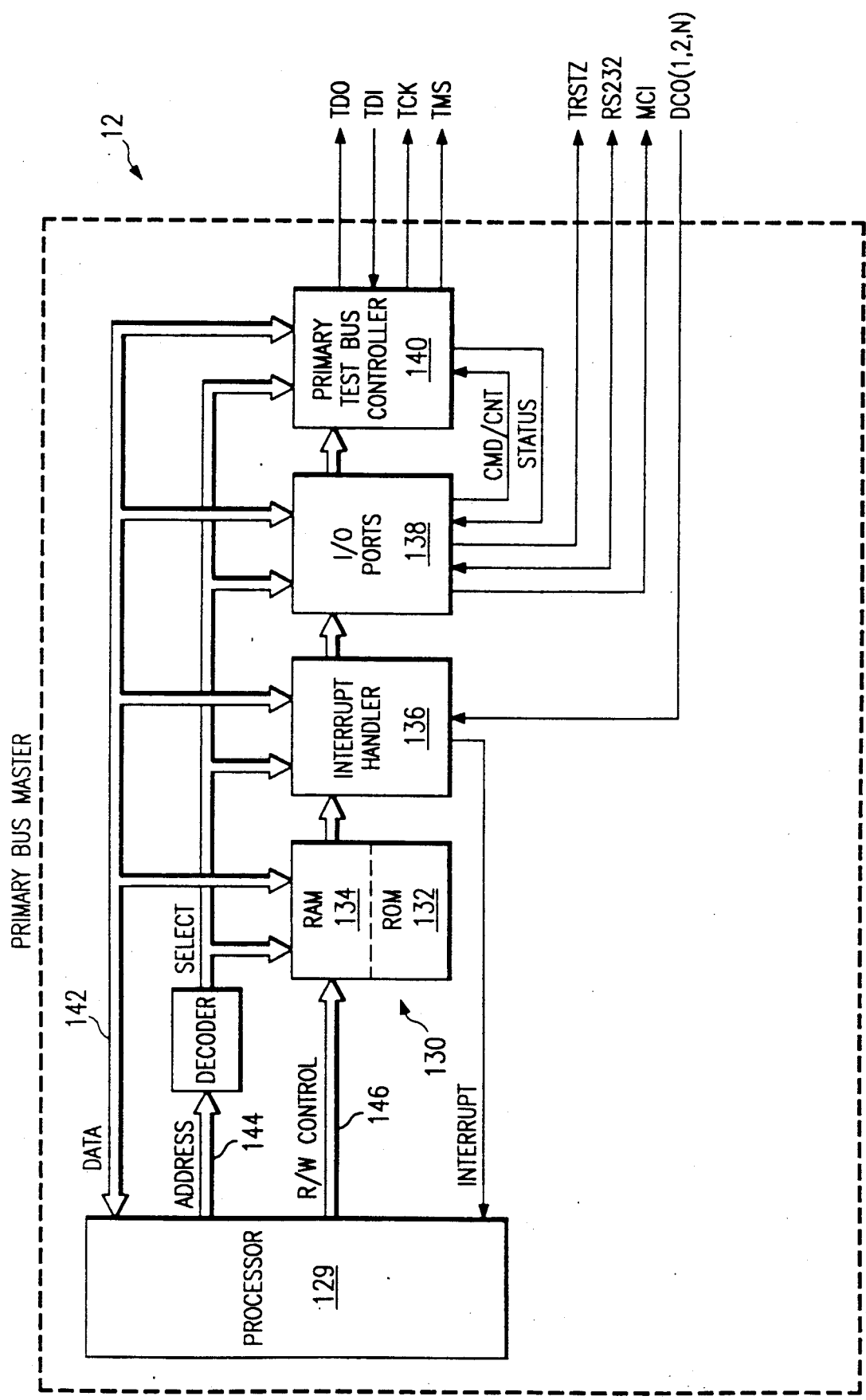
FIG. 10 illustrates a block diagram of the primary bus master of the present invention.

In FIG. 9, an example is shown how to connect a plurality DSMs together vertically (1 through M) and horizontally (1 through N) to create a scan path network. The connections for horizontal expansion of DSMs has been described and is simply done by connecting the DSMs connected on the primary scan path in series from the TDO output of a first primary DSM (1:1) to the TDO input of the next primary DSM (N:1) in the scan path as shown in FIG. 10. Also, the primary control signals, TMS and TCK, are routed in parallel to each DSM connected together on the primary scan path.

The connection for expanding from a primary, first vertical level DSM (1:1) 18 to a second vertical level DSM (1:2) 126, involves connecting the DTDO, DTDI, and DTMSx signals of the first vertical level DSM 18 up to the TDI, TDO and TMS signals of the second vertical level DSM 126. Expansion to a third vertical level DSM (1:3) (not shown) from a second vertical level DSM (1:2) is accomplished by making the same connections between the lower vertical level DSM and the next higher level DSM. Using this interconnection approach, it is possible to stack DSMs to any vertical level (1:M) 128.

In FIG. 9, it is important to note that primary test bus clock (TCK) and control (TMS) signals are routed directly up to each vertical DSM and are input to each DSM's TCK and OTMS input, respectively. When stacking DSMs vertically the primary TMS signal is input to the DSM's OTMS input (See FIG. 2). The primary TMS signal is then selected to be output on one of the DTMS1-4 output signals to the TMS input of the next vertical level DSM. In this way, the propagation delay from the primary TMS signal to any vertical level of DSM is constant and equal to the OTMS to DTMSx delay through a DSM. This overcomes the skewing problem that would occur due to the additive delays incurred if the primary TCK and TMS signals were routed through each vertical level DSM from the TCK and TMS to the DTCK and DTMSx, respectively.

By combining the vertical and horizontal growth capabilities of the DSMs in FIG. 7, a network of DSMs (N:M) can be created to support a hierarchical system scan path architecture.

PRIMARY BUS MASTER OPERATION AND ARCHITECTURE

An example implementation of the primary bus master circuit 12 is shown in FIG. 10. The circuit is a typical computer architecture comprising of a processor 129 and peripheral circuits including memory (ROM 132 and RAM 134), interrupt handler 136, input and output (I/O) ports 138, and a primary test bus controller circuit 140. The processor 129 communicates to the peripherals via its data, address, and control buses 142, 144 and 146. Each peripheral is selected by the address decoder logic for a read or write operation in response to a particular address or range of addresses output from the processor 129. Once selected a peripheral receives read or write (R/W) control input from the processor 129 to allow data to be transferred between the processor and selected peripheral.

The memory peripheral 130 contains both Read Only Memory (ROM 132) and Random Access Memory (RAM 134). The processor operates by executing instructions and data stored in the memory. The ROM 132 is used for permanent memory storage and the RAM 134 is sued for temporary memory storage.

The interrupt handler peripheral 136 comprises logic required to receive and latch a plurality of interrupt inputs and to output a single interrupt signal to the processor 129. Each interrupt input can be enabled or masked off by the processor. When an enabled interrupt input is received, the handler 136 will latch the input then notify the processor 129 via its single interrupt output. The processor 129 will respond to the interrupt and read the latches inside the handler to determine which interrupt input requested service. After identifying the interrupt, the processor 129 executes a routine from memory to service the interrupt. In this example, the interrupt handler receives multiple device condition outputs (DCO 1,2,..N). The DCO interrupts are input to the primary bus master from DSMs attached to the primary bus 14 as shown in FIGS. 7 and 8.

The I/O port 138 provides the means for the processor to input and output control and data to other peripherals in the circuit as well as circuits external to the primary bus master 12. The I/O port 138 output command and count (CMD/CNT) information to the primary test bus controller peripheral 140 and a test reset (TRSTZ) and master condition input (MCI) signal onto the primary bus 16 shown in FIGS. 7 and 8. The I/O port 138 receives status input from the primary test bus controller. To provide an interface to other devices the I/O port inputs and outputs data on standard communication ports such as RS-232.

Figure 11:
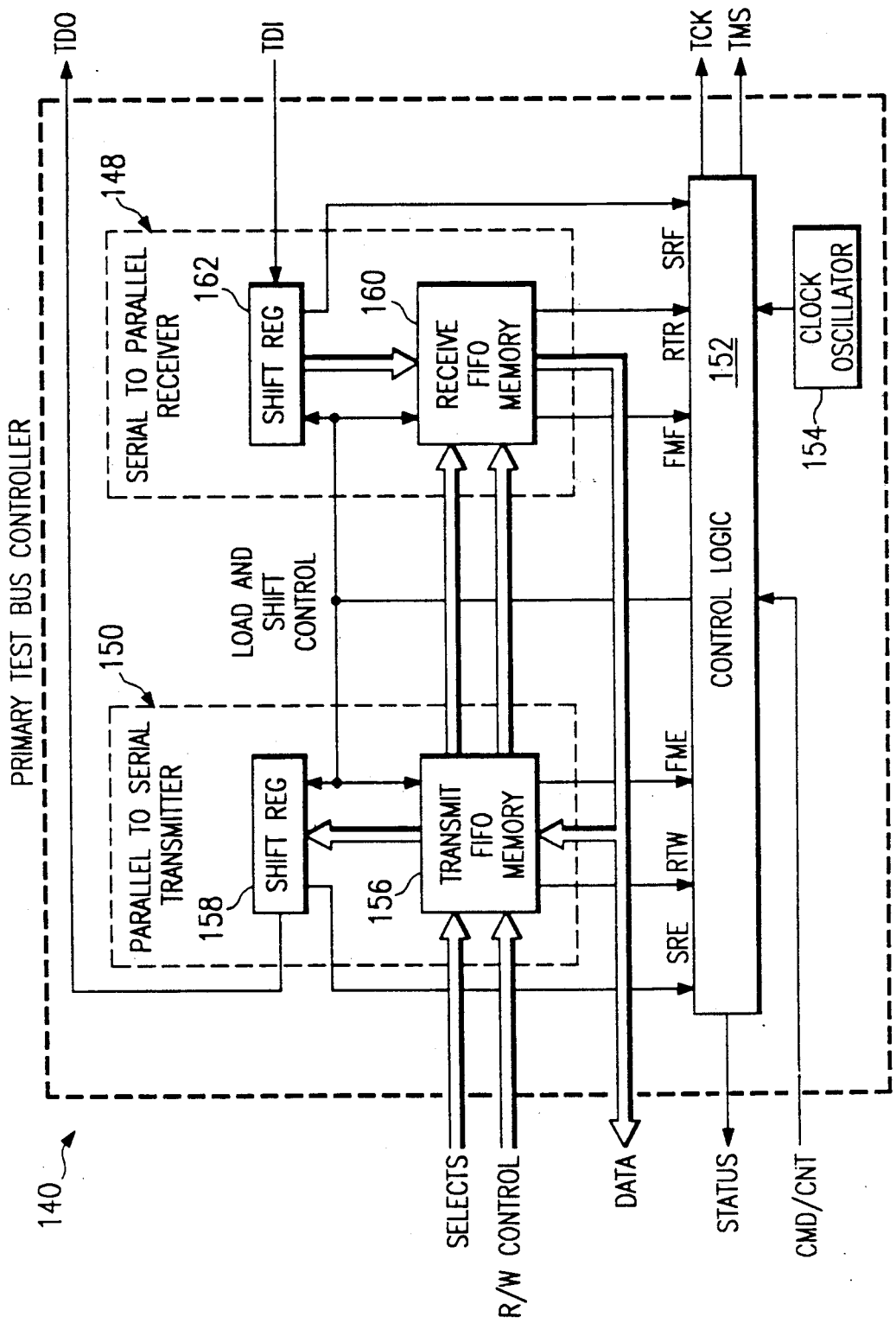
FIG. 11 illustrates a block diagram of the primary test bus controller of the test bus master.

The primary test bus controller 140 provides the circuitry for transmitting and receiving serial data and control on the primary bus, via the TCK, TMS, TDI and TDO signals. In FIG. 11, the architecture of the primary test bus controller is shown. The primary test bus controller 140 comprises a serial to parallel receiver section 148 to store incoming serial data from the TDI input, a parallel to serial transmitter section 150 to output serial data onto the TDO output, a control logic section 152 to control the transmitter and receiver sections and to generate the TCK and TMS output control signals, and a clock oscillator 154 to produce the clock required to operate the control logic section.

The parallel-to-serial transmitter 150 contains a first in first out (FIFO) memory 156 and a parallel input serial output shift register 158. The processor 129 loads the FIFO memory 156 with data using the data, select and R/W control buses. The processor 129 determines whether the FIFO 156 is Ready to Write (RTW) by reading the status output from the control logic 152 via the I/O port 138.

The serial-to-parallel receiver 148 contains a first in first out (FIFO) memory 160 and and a serial input parallel output shift register 162. The processor 129 unloads the data from the FIFO memory 160 using the data, select, and Read/Write control buses. The processor determines whether the FIFO 160 is Ready to Read (RTR) by reading the status output from the control logic 152 via the I/O port peripheral 138.

When the processor has filled the transmitter FIFO 156 with data to be shifted out onto the primary bus via the TDO output, a command and count (CMD/CNT) pattern in written into the I/O port 138 and output to the control logic section 152 of the primary bus controller. The command informs the control logic 152 to execute a shift operation. The count value specifies how many bits are to be shifted.

In response to the CMD/CNT input, the control logic 152 outputs control causing the transmitter's shift register 158 to upload data from the FIFO memory 156. After the transmitter 150 is setup to output serial data, the receiver section 148 is enabled to store incoming serial data from the TDI input. Following this procedure, the control logic 152 output control on the TCK and TMS outputs to start shifting data on the primary bus 14 and sends status back to the processor 129 that the shift operation is in progress. The length of the shift operation is determined by the count value input via the CMD/CNT bus. The count value is loaded into an internal count down counter inside the control logic 152. The counter is decremented each time a serial data bit is transferred on the primary bus 14. When the counter reaches a minimum count the control logic 152 terminates the shift operation and outputs status to the processor 129 that the shift operation is complete.

When a shift operation is started, the control logic 152 monitors output signals from the transmit and receive shift registers 158 and 162 which indicate when the shift registers are empty and full, respectively. When the transmit shift register shifts out the last data bit, it outputs a Shift Register Empty (SRE) signal to the control logic. When the control logic 152 receives the SRE input it outputs control to cause the next word in the transmit FIFO 156 memory to be uploaded into the shift register 158.

Similarly, when the receiver shift register 162 accepts the last data bit it can hold, it outputs a Shift Register Full (SRF) signal to the control logic 152. When the control logic receives the SRF input it outputs control to cause the data in the receive shift register 162 to be downloaded into the FIFO memory 160. The data transfers between shift registers and FIFOs are performed in such a way that the shift operation on the primary bus 14 is not interrupted.

As the transmit FIFO 156 unloads data into the shift register 158, vacancies appear in its internal memory array. When a memory location is vacant the transmit FIFO 156 outputs a ready to write (RTW) signal to inform the processor that it can accept data. When the processor 129 receives the RTW signal via the status output from the control logic 152, it writes data into the transmit FIFO 156 via the data, select, and R/W control buses.

Similarly, as the receive FIFO 160 loads data from the shift register 162, its memory locations begin to fill. When a memory location is loaded, the receive FIFO 160 outputs a ready to read (RTR) signal to inform the processor 129 that it can output data. When the processor 129 receives the RTR signal via the status output from the control logic 152, it reads data from the receive FIFO 160 via the data, select, and R/W control buses.

In the event that the processor 129 is unable to service the FIFO's RTW and RTR requests, the transmit and receive memories 156 and 160 will eventually empty and fill respectively. When the transmit FIFO 156 empties, it outputs a FIFO Memory Empty (FME) signal. When the receive FIFO 1560 fills, it outputs a FIFO Memory Full (FMF) signal. The control logic 152, upon receiving these condition inputs, will suspend the shift operation on the primary bus 14 and output status information to the processor 129 to indicate that shifting has been paused.

When the processor 129 is once again able to service the FIFO memories 156 and 160, it will initiate read and write operations to allow the shift operation to be resumed. As memory locations in the transmit FIFO 156 are filled by the processor write operations, the FME input is deactivated. Likewise, as memory locations in the receive FIFO 160 are emptied by the processor read operations, the FMF input is deactivated. When both FME and FMF signals are deactivated, the control logic resumes the shift operation and outputs status to the processor to indicate that shifting has been resumed.

When the counter inside the control logic 152 has counted down to a minimum count the control logic 152 will terminate the shift operation and output status to the processor 129 indicating the shift operation is complete.

REMOTE BUS MASTER ARCHITECTURE AND OPERATION

Figure 12:
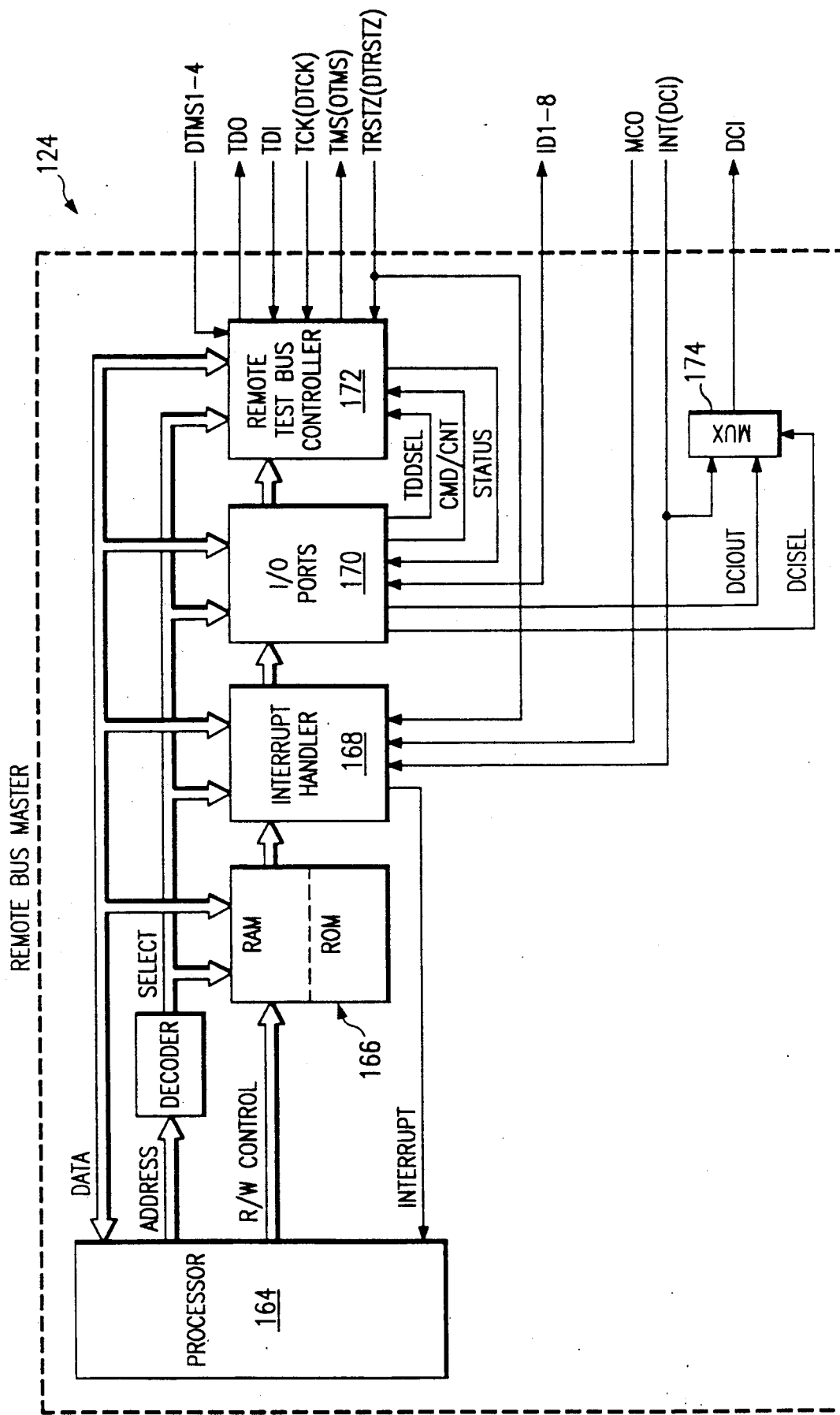
FIG. 12 illustrates a block diagram of the remote bus master of the present invention.

An example implementation of the remote bus master circuit 124 is shown in FIG. 12. The architecture is similar to the primary bus master in that it has a processor 164 and peripherals including memory, interrupt handler 168, I/O port 170 and remote test bus controller 172. The architecture also includes a 2:1 multiplexer 174 allowing the device condition output (DCI) to be driven from the I/O port or from an external DCI interrupt input.

The interrupt handler 168 operates as described in connection with the primary bus master 12. The interrupt handler 168 receives a test reset (TRSTZ) input, a master condition output (MCO) input, and a DCI input from a scan path as shown in FIG. 6:

The I/O port 170 operates as described in connection with the primary bus master. The I/O port 170 outputs command and count (CMD/CNT) information and a TDOSEL signal to the remote test bus controller. Also the I/O port 170 outputs DCI output (DCIOUT) and DCI select (DCISEL) signals to the 2:1 multiplexer. The I/O port 170 receives status input from the remote test bus controller 172 and is capable of receiving or driving data on the ID1-8 bus.

The ID1-8 data bus and MCO and DCI signals allow the remote bus master 124 to function with the DSM 18 and primary bus master 12 to execute the communications protocol described in this specification. When the remote bus master is executing a communications protocol the DCISEL signal will be set to cause the multiplexer 174 to output the DCOOUT signal onto the DCI output. When a remote bus master 124 is not executing a communications protocol it can be set to allow the multiplexer 174 to output the external interrupt input (DCI) onto the DCI output.

Figure 13:
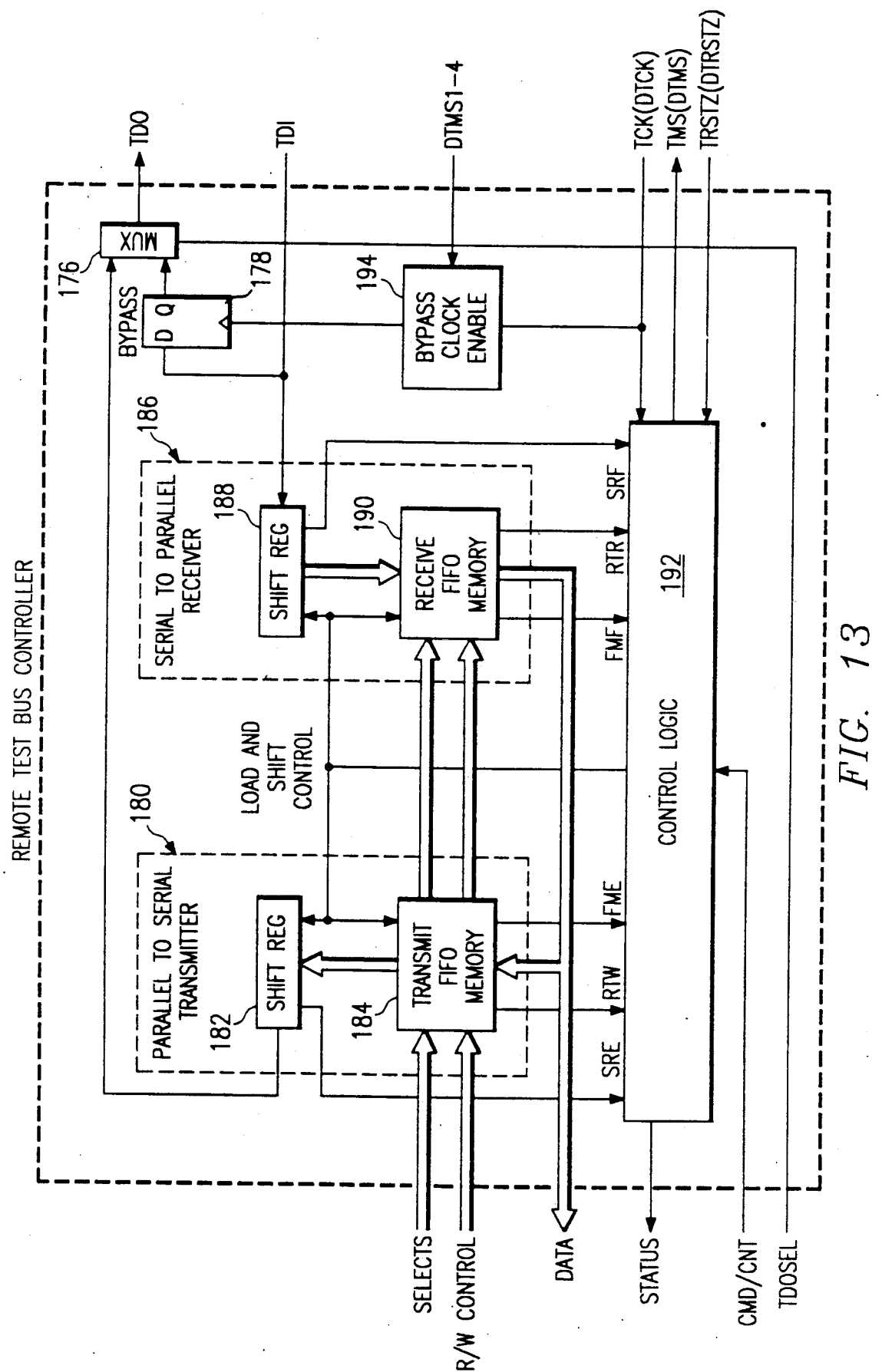
FIG. 13 illustrates a block diagram of the remote test bus controller of the remote master.

The remote test bus controller 172 provides the circuitry for transmitting and receiving serial data and control on the secondary bus, via the TCK, TMS, TDI and TDO signals. In FIG. 13, the architecture of the remote test bus controller is shown. The architecture and operation is similar to that of the primary test bus controller. The main difference is that the remote test bus controller 172 receives the TCK and TRSTZ input from external source. It also receives DTMS inputs from the DSM and contains a bypass clock enable circuit, a 2:1 multiplexer 176 and flip flop 178 to provide a scan bypass path from TDI to TDO when the remote test bus controller is disabled.

This multiplexing of the TDO signal between the bypass flip flop 178 and the transmit shift register allows the remote test bus controller to act as either a simple shift register on the external scan path or a bus master capable of issuing control to shift data on the external scan path. The remote bus controller also comprises a transmitter 180 (including a shift register 182 and FIFO 184), a receiver 186 (including a shift register 188 and a FIFO 190) and control logic 192, as described in connection with FIG. 11.

When the remote test bus controller is disabled, the TDOSEL input from the I/O port selects the Q output from the bypass D flip flop to drive the TDO output signal. While disabled, the remote test bus controller 124 receives TCK and DTMS1-4 input from the DSM to cause the bypass flip flop 178 to shift data from the TDI input to the TDO output, via the 2:1 multiplexer 176. The bypass clock enable circuit 194 receives TCK and DTMS1-4 inputs and outputs a clock signal to the bypass flip flop 178. The bypass clock enable circuit 194 is activated to output the clock to the bypass flip flop 178 when one of the DTMS1-4 inputs is selected for scan operation. When no DTMS1-4 input is selected or when the scan operation being performed is temporarily paused, the clock output to the bypass flip flop 178 is stopped and the flip flop remains in its present state. If the bypass flip flop 178 clock input was not gated on and off by the bypass clock enable circuit 194, the data bit in the bypass flip flop 178 would be lost when a scan operation is paused. In this way, a scan operation controlled by the primary bus master allows data to be shifted through the bypass flip flop from the TDI input through the flip flop and multiplexer to the TDO output. When the remote bus controller is enabled, the TDOSEL input from the I/O port selects the output of the transmit shift register to drive the TDO output signal via the 2:1 multiplexer and the remote test bus controller operates to transmit and receive serial data as described in connection with the primary test bus controller.

Although the present invention has been described in detail, it should be understood that various changes, substitutions and alterations can be made herein without departing from the spirit and scope of the invention as defined by the appended claims.

What is claimed is:

1. Circuitry for performing serial-scan testing of a plurality of predefined circuits, each predefined circuit having a plurality of secondary scan paths, comprising:
    a primary bus for carrying control and data signals to the circuits;
    a primary bus controller for transmitting signals to and receiving signals from said primary bus;
    a primary scan path of serially connected selected secondary scan paths of selected ones of said plurality of predefined circuits;
    device select modules coupled to said primary bus and associated with each one of said predefined circuits for selectively coupling one of said secondary scan paths associated with said one predefined circuit to the primary scan path; and
    a remote bus controller associated with and coupled to each of said device select modules operable to perform serial-scan testing on said associated predefined circuit independently of said primary bus controller.

2. The circuitry of claim 1 and further comprising a parallel bus coupling said remote bus controller to said device select module.

3. The circuitry of claim 2 and further comprising tristate devices associated with said remote bus controller and said device select module to selectively decouple said remote bus controller or said device select module from said parallel bus.

4. The circuitry of claim 3 and further comprising pullup and pull-down resistors connected between said parallel bus and respective predetermined voltages such that an identifying code may be placed on said parallel bus during periods when neither the remote bus controller or the device select module is outputting data to the parallel bus.

5. The circuitry of claim 1 wherein said remote bus controller comprises:
    a processor to execute test programs;
    a memory coupled to said processor to store said test programs;
    input/output circuitry coupled to said processor for reading and writing data to said parallel bus; and
    a test bus controller for transmitting and receiving serial data coupled to said processor and the test bus.

6. The circuitry of claim 5 wherein said test bus controller includes a flip flop to provide a scan bypass path when the remote bus controller is disabled.

7. The circuitry of claim 1 wherein said device select module includes a primary test port for receiving control and data signals from the primary bus controller.

8. The circuitry of claim 7 wherein said device select module further includes a remote test port for receiving control and data signals from the remote bus controller.

9. The circuitry of claim 7 and wherein said device select module further comprises circuitry responsive to said primary test port to enable or disable said remote test port.

10. Circuitry for performing serial-scan testing of a plurality of predefined circuits, each predefined circuit including a plurality of secondary scan paths, comprising:
    a primary bus carrying control and data signals and defining a primary scan path;
    a primary bus controller for transmitting signals to and receiving signals from said bus to perform scan test operations; and
    a remote bus controller for selectively controlling an associated predefined circuit responsive to control signals from said primary bus controller.

11. The circuitry of claim 10 and further comprising a bidirectional bus coupled to said primary and remote bus controllers and operable to provide communications between said bus controllers.

12. The circuitry of claim 11 and further comprising a device select module coupled to said bidirectional bus and said primary controller, said device select module operable to convert serial data from said primary bus controller to parallel data for the bidirectional bus and to convert parallel data from said bidirectional bus to serial data for said primary bus controller.

13. The circuitry of claim 12 wherein said bidirectional bus comprises a plurality of signal lines and wherein said device select module includes a shift register coupled to said bidirectional bus in parallel such that signals received from said bidirectional bus may be shifted to said primary bus controller in serial, and signals received from said primary bus controller in serial may be shifted into said shift register and output to said bidirectional bus in parallel.

14. The circuitry of claim 13 and further comprising pull-up and pull-down resistors connected between said bidirectional bus and respective predetermined voltages such that an identifying code may be generated on said bidirectional bus during periods when neither the remote bus controller or the device select module is outputting signals to the bidirectional bus.

15. The circuitry of claim 12 wherein said secondary scan paths are coupled to said remote bus controller such that said remote bus controller may output signals to and receive signals from the secondary scan path selected by said device select module.

16. The circuitry of claim 15 wherein said remote bus controller includes a shift register operable to pass signals between the selected secondary scan path and the device select module when said remote bus controller is not controlling the selected secondary scan path.

17. The circuitry of claim 16 wherein said remote bus controller shift register is further operable to pass signals to and from the primary bus controller while the primary bus controller is performing scan test operations.

18. The circuitry of claim 12 and further comprising interrupt circuitry coupled to said remote bus controller and said primary bus controller such that said remote bus controller can issue interrupts to said primary bus controller and said primary bus controller can issue interrupts to said remote bus controller.

19. The circuitry of claim 18 wherein said interrupt circuitry is further coupled to said device select module such that said device select module can issue interrupts to said primary bus controller or said remote bus controller.

20. The circuitry of claim 19 wherein said device select module includes a counter which can issue interrupts when a predetermined count is reached.

21. A method of communicating from a primary bus controller coupled to a plurality of predefined circuits to one of a plurality of respective remote bus controllers associated with said predefined circuits, the remote bus controllers being operable to perform serial-scan testing on the respective predefined circuits, comprising the steps of:

receiving an interrupt from the primary bus controller;

inputting a data pattern from the primary bus controllers in response to said interrupt;

identifying the data pattern;

transmitting an acknowledge signal to the primary bus controller if the data pattern is a header command; and receiving additional data patterns from the primary bus controller in response to the acknowledge signal.

22. The method of claim 21 and further comprising the step of receiving a stop command to the remote bus controller to indicate the end of the data pattern sequence.

23. The method of claim 21 and wherein the step of inputting the data pattern comprises the step of receiving a data pattern from a device select module coupled to the remote bus controller via a parallel bus.

24. The method of claim 23 wherein said step of identifying the data pattern comprises the step of comparing the signal on the parallel bus to a unique predetermined identification code associated with the remote bus controller.

25. The method of claim 24 wherein said step of transmitting an acknowledge signal comprises the step of transmitting an acknowledge signal only if the signal on the parallel bus is not equal to the identification code of the remote bus controller.

26. The method of claim 21 and further comprising the step of receiving an acknowledge signal from the primary bus controller in response to the acknowledge signal sent to the primary bus controller.

27. The method of claim 26 and further comprising the step of transmitting a second acknowledge signal to the primary bus controller in response to the acknowledge signal from the primary bus controller to indicate readiness to receive additional data patterns.

28. The method of claim 21 and further comprising the step of receiving a count pattern indicating the number of additional data patterns which will be sent by the primary bus controller.

29. The method of claim 21 and further comprising the step of performing a test on said respective circuit in response to the commands.

30. The method of claim 29 and further comprising the step of transmitting a signal to the primary bus controller indicating that the test is complete.

31. Circuitry for communicating from a primary bus controller coupled to a plurality of predefined circuits to one of a plurality of respective remote bus controllers associated with said predefined circuits, the remote bus controllers being operable to perform serial-scan testing on the respective predefined circuits, comprising:

circuitry for receiving an interrupt from the primary bus controllers;

circuitry for receiving a data pattern from the primary bus controllers;

circuitry for identifying the data pattern;

circuitry for transmitting an acknowledge signal to the primary bus controller if the data pattern is a header command; and circuitry for receiving additional data patterns from the primary bus controller in response to the acknowledge signal.

32. The circuitry of claim 31 and further comprising circuitry for receiving a stop data pattern to the remote bus controller to indicate the end of the data pattern sequence.

33. The circuitry of claim 31 wherein said circuitry for receiving the data pattern comprises circuitry for receiving a data pattern from a device select module coupled to the remote bus controller via a parallel bus.

34. The circuitry of claim 33 wherein said circuitry for identifying the data pattern comprises circuitry for comparing the signal on the parallel bus to a unique predetermined identification code associated with the remote bus controller.

35. The circuitry of claim 34 wherein said circuitry for transmitting an acknowledge signal comprises circuitry for transmitting an acknowledge signal only if the signal on the parallel bus is not equal to the identification code of the remote bus controller.

36. The circuitry of claim 31 and further comprising circuitry for receiving an acknowledge signal from the primary bus controller in response to the acknowledge signal sent to the primary bus controller.

37. The circuitry of claim 36 and further comprising circuitry for transmitting a second acknowledge signal to the primary bus controller in response to the acknowledge signal from the primary bus controller to indicate readiness to receive additional data patterns.

38. The circuitry of claim 31 and further comprising circuitry for receiving a count pattern indicating the number of additional data patterns which will be sent by the primary bus controller.

39. The circuitry of claim 31 and further comprising circuitry for performing a test on said respective circuit in response to the commands.

40. The circuitry of claim 39 and further comprising circuitry for transmitting a signal to the primary bus controller indicating that the test is complete.

41. A method of communicating to a primary bus controller coupled to a plurality of predefined circuits from one of a plurality of respective remote bus controllers associated with said predefined circuits, the remote bus controllers being operable to perform serial-scan testing on the respective predefined circuits, comprising the steps of:

receiving an interrupt from the remote bus controllers;

inputting a data pattern from the remote bus controllers in response to said interrupt;

identifying the data pattern;

transmitting an acknowledge signal to the remote bus controller if the data pattern is a header command; and receiving additional data patterns from the remote bus controller in response to the acknowledge signal.

42. The method of claim 41 and further comprising the step of receiving a stop command from the remote bus controller to indicate the end of the data pattern sequence.

43. The method of claim 41 and wherein the step of inputting the data pattern comprises the step of receiving a data pattern via a device select module coupled to the remote bus controller via a parallel bus.

44. The method of claim 43 wherein said step of identifying the data pattern comprises the step of comparing the signals on the parallel bus to a unique predetermined identification code associated with the remote bus controller.

45. The method of claim 44 wherein said step of transmitting an acknowledge signal comprises the step of transmitting an acknowledge signal only if the identified data pattern is not equal to the identification code of the remote bus controller.

46. The method of claim 41 and further comprising the step of receiving an acknowledge signal from the remote bus controller in response to the acknowledge signal sent to the remote bus controller.

47. The method of claim 46 and further comprising the step of transmitting a second acknowledge signal to the remote bus controller in response to the acknowledge signal from the remote bus controller to indicate readiness to receive additional data patterns.

48. The method of claim 41 and further comprising the step of receiving a count pattern indicating the number of additional data patterns which will be sent by the remote bus controller.

49. The method of claim 41 and further comprising the step of performing a test on one of the predefined circuits in response to the commands.

50. Circuitry for communicating to a primary bus controller coupled to a plurality of predefined circuits from one of a plurality of respective remote bus controllers associated with said predefined circuits, the remote bus controllers being operable to perform serial-scan testing on the respective predefined circuits, comprising:
   circuitry for receiving an interrupt from the remote bus controller;
   circuitry for receiving a data pattern from the remote bus controller;
   circuitry for identifying the data pattern;
   circuitry for transmitting an acknowledge signal if the data pattern is a header command; and
   circuitry for receiving additional data patterns from the remote bus controller in response to the acknowledge signal.

51. The circuitry of claim 50 and further comprising circuitry for receiving a stop command from the remote bus controller to indicate the end of the data pattern sequence.

52. The circuitry of claim 50 wherein said circuitry for receiving the data pattern comprises circuitry for receiving a data pattern from a device select module coupled to the remote bus controller via a parallel bus.

53. The circuitry of claim 52 wherein said circuitry for identifying the data pattern comprises circuitry for comparing the signals on the parallel bus to a unique predetermined identification code associated with the remote bus controller.

54. The circuitry of claim 53 wherein said circuitry for transmitting an acknowledge signal comprises circuitry for transmitting an acknowledge signal only if the identified signal is not equal to the identification code of the remote bus controller.

55. The circuitry of claim 50 and further comprising circuitry for receiving an acknowledge signal from the remote bus controller in response to the acknowledge signal sent to the remote bus controller.

56. The circuitry of claim 55 and further comprising circuitry for transmitting a second acknowledge signal to the remote bus controller in response to the acknowledge signal from the remote bus controller to indicate readiness to receive additional data patterns.

57. The circuitry of claim 50 and further comprising circuitry for receiving a count pattern indicating the number of additional data patterns which will be sent by the remote bus controller.

58. The circuitry of claim 50 and further comprising circuitry for performing a test on one of the predefined circuits in response to the commands.

* * * * *